(12) United States Patent
Lee et al.

(10) Patent No.: US 10,910,045 B2
(45) Date of Patent: Feb. 2, 2021

(54) STORAGE DEVICE HAVING IMPROVED CACHE PERFORMANCE AND METHOD OF OPERATING THE SAME

(71) Applicant: SK hynix Inc., Gyeonggi-do (KR)

(72) Inventors: Joo Young Lee, Seoul (KR); Hoe Seung Jung, Seoul (KR)

(73) Assignee: SK hynix Inc., Gyeonggi-do (KR)

(*) Notice: Subject to any disclaimer, the term of this patent is extended or adjusted under 35 U.S.C. 154(b) by 0 days.

(21) Appl. No.: 16/443,367

(22) Filed: Jun. 17, 2019

(65) Prior Publication Data
US 2020/0135270 A1    Apr. 30, 2020

(30) Foreign Application Priority Data

Oct. 29, 2018 (KR) .................. 10-2018-0130284

(51) Int. Cl.
| | | |
|---|---|---|
| *G11C 7/10* | (2006.01) | |
| *G11C 11/56* | (2006.01) | |
| *G06F 12/02* | (2006.01) | |
| *G06F 12/0873* | (2016.01) | |
| *G11C 16/14* | (2006.01) | |

(52) U.S. Cl.
CPC ...... *G11C 11/5628* (2013.01); *G06F 12/0246* (2013.01); *G06F 12/0873* (2013.01); *G11C 11/5642* (2013.01); *G11C 16/14* (2013.01)

(58) Field of Classification Search
CPC . G11C 11/5628; G11C 11/5642; G11C 16/14; G06F 12/0246; G06F 12/0873
USPC ...................................... 365/185.05
See application file for complete search history.

(56) References Cited

U.S. PATENT DOCUMENTS

| | | | |
|---|---|---|---|
| 7,471,559 B2 | 12/2008 | Shibata | |
| 9,704,583 B2 * | 7/2017 | Song | ....................... G11C 16/10 |
| 2002/0126531 A1 * | 9/2002 | Hosono | ............... G11C 11/5621 |
| | | | 365/185.17 |
| 2007/0002631 A1 * | 1/2007 | Kang | .................. G11C 11/5628 |
| | | | 365/185.21 |
| 2010/0185803 A1 * | 7/2010 | Gjoerup | .............. G06F 13/4282 |
| | | | 711/103 |

FOREIGN PATENT DOCUMENTS

| | | |
|---|---|---|
| KR | 10-0919156 | 9/2009 |
| KR | 10-2010-0021868 | 2/2010 |

* cited by examiner

*Primary Examiner* — Tha-O H Bui
(74) *Attorney, Agent, or Firm* — IP & T Group LLP

(57) ABSTRACT

A storage device includes a memory device including a memory cell array and a page buffer group coupled to the memory cell array, and a memory controller configured to store a plurality of cache data chunks to be sequentially programmed, and configured to input a next cache data chunk corresponding to a next program sequence to the page buffer group, when programming of Least Significant Bit (LSB) data of a cache data chunk among the plurality of cache data chunks is completed.

20 Claims, 17 Drawing Sheets

STORAGE DEVICE HAVING IMPROVED CACHE PERFORMANCE AND METHOD OF OPERATING THE SAME

CROSS-REFERENCE TO RELATED APPLICATION

The present application claims priority under 35 U.S.C. § 119(a) to Korean patent application number 10-2018-0130284, filed on Oct. 29, 2018, which is incorporated herein by reference in its entirety.

BACKGROUND

Field of Invention

Various embodiments of the present disclosure generally relate to an electronic device, and more particularly, to a storage device and a method of operating the storage device.

Description of Related Art

A storage device typically serves to store data under the control of a host device, such as a computer or a smartphone. The storage device may include a memory device in which data is stored and a memory controller which controls the memory device. Such memory devices are classified into a volatile memory device and a nonvolatile memory device.

The volatile memory device is a memory device in which data is stored only when power is supplied and in which stored data is lost when the supply of power is interrupted. Examples of the volatile memory device include a Static Random Access Memory (SRAM) and a Dynamic Random Access Memory (DRAM).

The nonvolatile memory device is a memory device in which stored data is retained even when the supply of power is interrupted. Examples of the nonvolatile memory device include a Read Only Memory (ROM), a Programmable ROM (PROM), an Electrically Programmable ROM (EPROM), an Electrically Erasable and Programmable ROM (EEPROM), and a flash memory.

SUMMARY

Various embodiments of the present disclosure are directed to a storage device having improved cache performance and a method of operating the storage device.

An embodiment of the present disclosure may provide for a storage device. The storage device may include a memory device including a memory cell array and a page buffer group coupled to the memory cell array, and a memory controller configured to store a plurality of cache data chunks to be sequentially programmed, and configured to input a next cache data chunk corresponding to a next program sequence to the page buffer group when programming Least Significant Bit (LSB) data of a current cache data chunk among the plurality of cache data chunks is completed.

An embodiment of the present disclosure may provide for a storage device. The storage device may include a memory device including a memory cell array and a page buffer group coupled to the memory cell array, and a memory controller including a write buffer and a write buffer controller, wherein the write buffer is configured to store a plurality of cache data chunks to be sequentially programmed, and wherein the write buffer controller is configured to delete the cache data chunk from the write buffer when programming a previous cache data chunk previously input to the page buffer group to the memory cell array has been completed while the plurality of cache data chunks are being input to the page buffer group.

An embodiment of the present disclosure may provide for a method for operating a storage device. The storage device may include a memory device including a memory cell array and a page buffer group coupled to the memory cell array, and a memory controller including a write buffer. The method may include storing host data as a plurality of cache data chunks in the write buffer, programming any one of the plurality of cache data chunks to the memory cell array while the plurality of cache data chunks are being sequentially input to the page buffer group, and inputting a next cache data chunk corresponding to a next program sequence to the page buffer group when programming LSB data of a current cache data chunk has been completed.

An embodiment of the present disclosure may provide for a memory system. The memory system comprising: a memory device including a page buffer group and a memory cell array, a write buffer configured to cache a sequence of data and a control unit configured to control the memory device to perform a cache program operation of programming current data currently stored in the page buffer group into the memory cell array while providing the page buffer group with subsequent data cached in the write buffer, wherein the control unit deletes the current data from the write buffer upon completion of programming of the current data, and wherein the control unit provides the subsequent data from the write buffer to the page buffer group upon completion of programming of a least significant bit (LSB) part of the current data.

An embodiment of the present disclosure may provide for a memory system. The memory system comprising: a plurality of memory devices each including a page buffer group and a memory cell array, a write buffer configured to cache a sequence of data and a control unit configured to control each of the memory devices to perform a cache program operation according to an interleaving scheme, wherein the control unit deletes the current data from the write buffer upon completion of programming of current data currently stored in the page buffer group into the memory cell array, and wherein the control unit provides subsequent data from the write buffer to the page buffer group upon completion of programming of a least significant bit (LSB) part of the current data.

DETAILED DESCRIPTION

Figure 1:
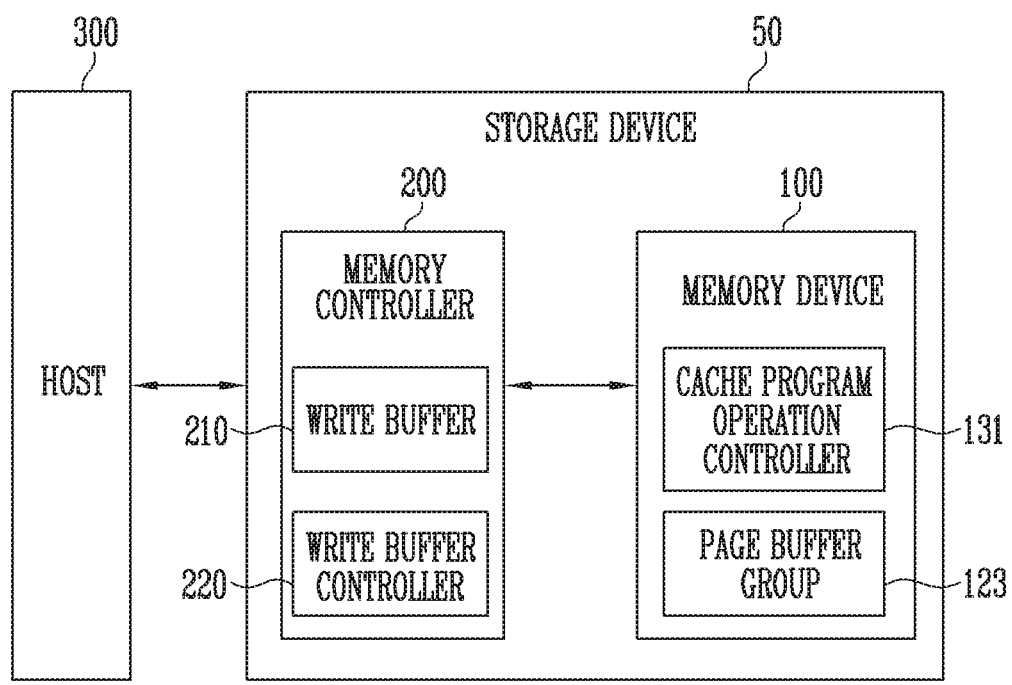
FIG. 1 is a diagram illustrating a storage device in accordance with an embodiment of the present disclosure.

Specific structural or functional descriptions in the embodiments of the present disclosure introduced in this specification or application are only for description of the embodiments of the present disclosure. The descriptions should not be construed as being limited to the embodiments described in the specification or application.

The present disclosure will not be described in detail based on embodiments. The present disclosure may, however, be embodied in many different forms and should not be construed as being limited to only the embodiments set forth herein, but should be construed as covering modifications, equivalents or alternatives falling within ideas and technical scopes of the present disclosure. However, this is not intended to limit the present disclosure to particular modes of practice, and it is to be appreciated that all changes, equivalents, and substitutes that do not depart from the spirit and technical scope of the present disclosure are encompassed in the present disclosure.

It will be understood that, although the terms "first" and/or "second" may be used herein to describe various elements, these elements should not be limited by these terms. These terms are only used to distinguish one element, from another element. For instance, a first element discussed below could be termed a second element without departing from the teachings of the present disclosure. Similarly, the second element could also be termed the first element.

It will be understood that when an element is referred to as being "coupled" or "connected" to another element, it can be directly coupled or connected to the other element or intervening elements may be present therebetween. In contrast, it should be understood that when an element is referred to as being "directly coupled" or "directly connected" to another element, there are no intervening elements present. Other expressions that describe the relationship between elements, such as "between", "directly between", "adjacent to" or "directly adjacent to" should be construed in the same way.

The terminology used herein is for the purpose of describing particular embodiments only and is not intended to be limiting. In the present disclosure, the singular forms are intended to include the plural forms as well, unless the context clearly indicates otherwise. It will be further understood that the terms "comprise", "include", "have", etc. when used in this specification, specify the presence of stated features, integers, steps, operations, elements, components, and/or combinations thereof but do not preclude the presence or addition of one or more other features, integers, steps, operations, elements, components, and/or combinations thereof.

Unless otherwise defined, all terms including technical and scientific terms used herein have the same meaning as commonly understood by one of ordinary skill in the art to which the present disclosure belongs. It will be further understood that terms used herein should be interpreted as having a meaning that is consistent with their meaning in the context of this specification and the relevant art and will not be interpreted in an idealized or overly formal sense unless expressly so defined herein.

Detailed description of functions and structures well known to those skilled in the art will be omitted to avoid obscuring the subject matter of the present disclosure. This aims to omit unnecessary description so as to make the subject matter of the present disclosure clear.

Various embodiments of the present disclosure will now be described more fully hereinafter with reference to the accompanying drawings, in which preferred embodiments of the present disclosure are illustrated, so that those of ordinary skill in the art can easily carry out the technical idea of the present disclosure.

FIG. 1 is a diagram illustrating a storage device in accordance with an embodiment of the present disclosure.

Referring to FIG. 1, a storage device 50 may include a memory device 100 and a memory controller 200 which controls the operation of the memory device 100. The storage device 50 may be a device which stores data under the control of a host 300, such as a mobile phone, a smartphone, an MP3 player, a laptop computer, a desktop computer, a game console, a television (TV), a tablet personal computer (PC), or an in-vehicle infotainment system.

The storage device 50 may be manufactured as any one of various types of storage devices depending on a host interface that is a communication scheme with the host 300. The storage device 50 may be implemented as any one of various types of storage devices, for example, a solid state drive (SSD), a multimedia card such as an MMC, an embedded MMC (eMMC), a reduced size MMC (RS-MMC), or a micro-MMC, a secure digital card such as an SD, a mini-SD, or a micro-SD, a universal storage bus (USB) storage device, a universal flash storage (UFS) device, a personal computer memory card international association (PCMCIA) card-type storage device, a peripheral component interconnection (PCI)-card type storage device, a PCI express (PCI-e or PCIe) card-type storage device, a compact flash (CF) card, a smart media card, and a memory stick.

The storage device 50 may be manufactured in any one of various types of package forms. For example, the storage device 50 may be manufactured in any one of various types of package forms, such as package on package (POP), system in package (SIP), system on chip (SOC), multi-chip package (MCP), chip on board (COB), wafer-level fabricated package (WFP), and wafer-level stack package (WSP).

The memory device 100 may store data. The memory device 100 is operated in response to the control of the memory controller 200. The memory device 100 may include a memory cell array including a plurality of memory cells which store data.

Each of the memory cells may be implemented as a single-level cell (SLC) capable of storing a single data bit, a multi-level cell (MLC) capable of storing two data bits, a triple-level cell (TLC) capable of storing three data bits, or a quad-level cell (QLC) capable of storing four data bits.

The memory cell array may include a plurality of memory blocks. Each memory block may include a plurality of memory cells. A single memory block may include a plurality of pages. In an embodiment, each page may be a unit by which data is stored in the memory device 100 or by which data stored in the memory device 100 is read. A memory block may be a unit by which data is erased. In an embodiment, the memory device 100 may take many alternative forms, such as a double data rate synchronous dynamic random access memory (DDR SDRAM), a low power double data rate fourth generation (LPDDR4) SDRAM, a graphics double data rate (GDDR) SDRAM, a low power DDR (LPDDR) SDRAM, a Rambus dynamic random access memory (RDRAM), a NAND flash memory, a vertical NAND flash memory, a NOR flash memory device, a resistive RAM (RRAM), a phase-change memory (PRAM), a magnetoresistive RAM (MRAM), a ferroelectric RAM (FRAM), or a spin transfer torque RAM (STT-RAM). In the present specification, for convenience of description, a description will be made on the assumption that the memory device 100 is a NAND flash memory.

The memory device 100 may receive a command and an address from the memory controller 200, and may access the area of the memory cell array, selected by the address. That is, the memory device 100 may perform an operation corresponding to the command on the area selected by the address. For example, the memory device 100 may perform a write operation (i.e., program operation), a read operation, and an erase operation. During a program operation, the memory device 100 may program data to the area selected by the address. During a read operation, the memory device 100 may read data from the area selected by the address. During an erase operation, the memory device 100 may erase data stored in the area selected by the address.

The memory device 100 may perform a normal program operation. The normal program operation may be an operation of programming current data to the memory cell array after completion of receiving the current data from the memory controller 200. During a normal program operation, the memory device 100 cannot receive subsequent data from the memory controller 200 while current data is being programmed.

The memory device 100 may perform a cache program operation. The cache program operation may be an operation of programming current data to the memory cell array while receiving subsequent data from the memory controller 200. During a cache program operation, the memory device 100 may receive the subsequent data from the memory controller 200 even while current data is being programmed. When pieces of successive data are programmed, the cache program operation may be performed faster than the normal program operation.

In an embodiment, the memory device 100 may include a page buffer group 123 and a cache program operation controller 131.

The page buffer group 123 may store data received from the memory controller 200. The page buffer group 123 may include a plurality of page buffers for storing the received data. The plurality of page buffers included in the page buffer group 123 may be electrically coupled to the memory cell array. Data stored in the plurality of page buffers may be programmed to the memory cell array. While pieces of current data stored in some of the plurality of page buffers are being programmed to the memory cell array, the remaining page buffers may receive subsequent data from the memory controller 200 and then store the subsequent data.

The cache program operation controller 131 may program the data stored in the page buffer group 123 to the memory cell array in response to a program command provided from the memory controller 200. In detail, the cache program operation controller 131 may perform a cache program operation on the data stored in the page buffer group 123. The cache program operation may be an operation of programming current data stored in the page buffer group to the memory cell array while the subsequent data is received from the memory controller 200 and stored in the page buffer group.

The cache program operation controller 131 may program the data stored in the page buffer group 123 to the memory cell array in the sequence of Least Significant Bit (LSB) data to Most Significant Bit (MSB) data configuring the stored data. For example, when each memory cell is a triple-level cell, the cache program operation controller 131 may program the data stored in the page buffer group 123 to the memory cell array in the sequence of Least Significant Bit (LSB) data, Central Significant Bit (CSB) data, and Most Significant Bit (MSB) data configuring the stored data.

The cache program operation controller 131 may provide a status read response to the memory controller 200 in response to a status read command provided by the memory controller 200. The status read response may include ready information. The ready information may indicate a status ready for a subsequent command due to completion of an operation for a current command. For example, the ready information may indicate whether a program operation performed on the data stored in the page buffer group 123 has been completed in response to a program command provided by the memory controller 200.

The memory controller 200 controls the overall operation of the storage device 50.

When power is applied to the storage device 50, the memory controller 200 may run firmware (FW). When the memory device 100 is a flash memory device, the memory controller 200 may run firmware such as a Flash Translation Layer (FTL) for controlling communication between the host 300 and the memory device 100.

In an embodiment, the memory controller 200 may receive data and a logical block address (LBA) from the host 300, and may translate the logical block address (LBA) into a physical block address (PBA) indicating the address of memory cells which are included in the memory device 100 and in which data is to be stored.

The memory controller 200 may control the memory device 100 so that a program operation, a read operation or an erase operation is performed in response to a request received from the host 300. During a program operation, the memory controller 200 may provide a program command, a physical block address (PBA), and data to the memory device 100. During a read operation, the memory controller 200 may provide a read command and a physical block address (PBA) to the memory device 100. During an erase operation, the memory controller 200 may provide an erase command and a physical block address (PBA) to the memory device 100.

In an embodiment, the memory controller 200 may autonomously generate a program command, an address, and data regardless of whether a request from the host 300 is received, and may transmit the program command, an address, and data to the memory device 100. For example, the memory controller 200 may provide commands, addresses, and data to the memory device 100 so as to perform background operations, such as a program operation for wear leveling and a program operation for garbage collection.

In an embodiment, the memory controller 200 may control at least two memory devices 100. In this case, the memory controller 200 may control the memory devices 100 in an interleaved manner to improve operating performance. The interleaved manner may be an operating manner in which the operating periods of at least two memory devices 100 are caused to overlap each other.

In an embodiment, the memory controller 200 may include a write buffer 210 and a write buffer controller 220.

The write buffer 210 may store host data received from the host 300. The write buffer 210 may store the received host data in units of cache data chunks. The received host data may be configured by a plurality of cache data chunks. The plurality of cache data chunks may be sequentially provided and programmed to the memory device 100 in a preset sequence.

The write buffer controller 220 may sequentially provide the plurality of cache data chunks stored in the write buffer 210 to the memory device 100. The write buffer controller 220 may provide the cache data chunks together with a program command for the cache data chunks to the memory device 100. The write buffer controller may be implemented with a processor, a firmware, or a circuitry for perform the write buffer control functions.

The write buffer controller 220 may determine a time point at which the cache data chunks stored in the write buffer 210 are to be provided to the memory device 100.

In an embodiment, the write buffer controller 220 may provide a current cache data chunk to the memory device 100. When a preset time has elapsed, the write buffer controller 220 may provide a subsequent cache data chunk to the memory device 100. The preset time may be a time point at which programming LSB data of the provided current cache data chunk to the memory cell array is completed.

In an embodiment, the write buffer controller 220 may delete the cache data chunk, programming of which into the memory cell array has been completed, from the write buffer 210. A storage area of the write buffer 210 in which the deleted cache data chunk was stored may receive subsequent host data from the host 300 and store the subsequent host data.

The write buffer controller 220 may provide a status read command to the memory device 100 in order to determine whether the programming of the cache data chunk stored in the write buffer 210 to the memory cell array has been completed. The write buffer controller 220 may provide the status read command to the memory device 100, and may acquire a status read response from the memory device 100. The write buffer controller 220 may determine a time point at which the programming of the cache data chunk, which is provided from the write buffer 210 to the page buffer, to the memory cell array is completed based on the ready information included in the status read response. The ready information may indicate whether the programming of the cache data chunk to the memory cell array has been completed in response to the program command provided by the write buffer controller 220.

The host 300 may communicate with the storage device 50 using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

Figure 2:
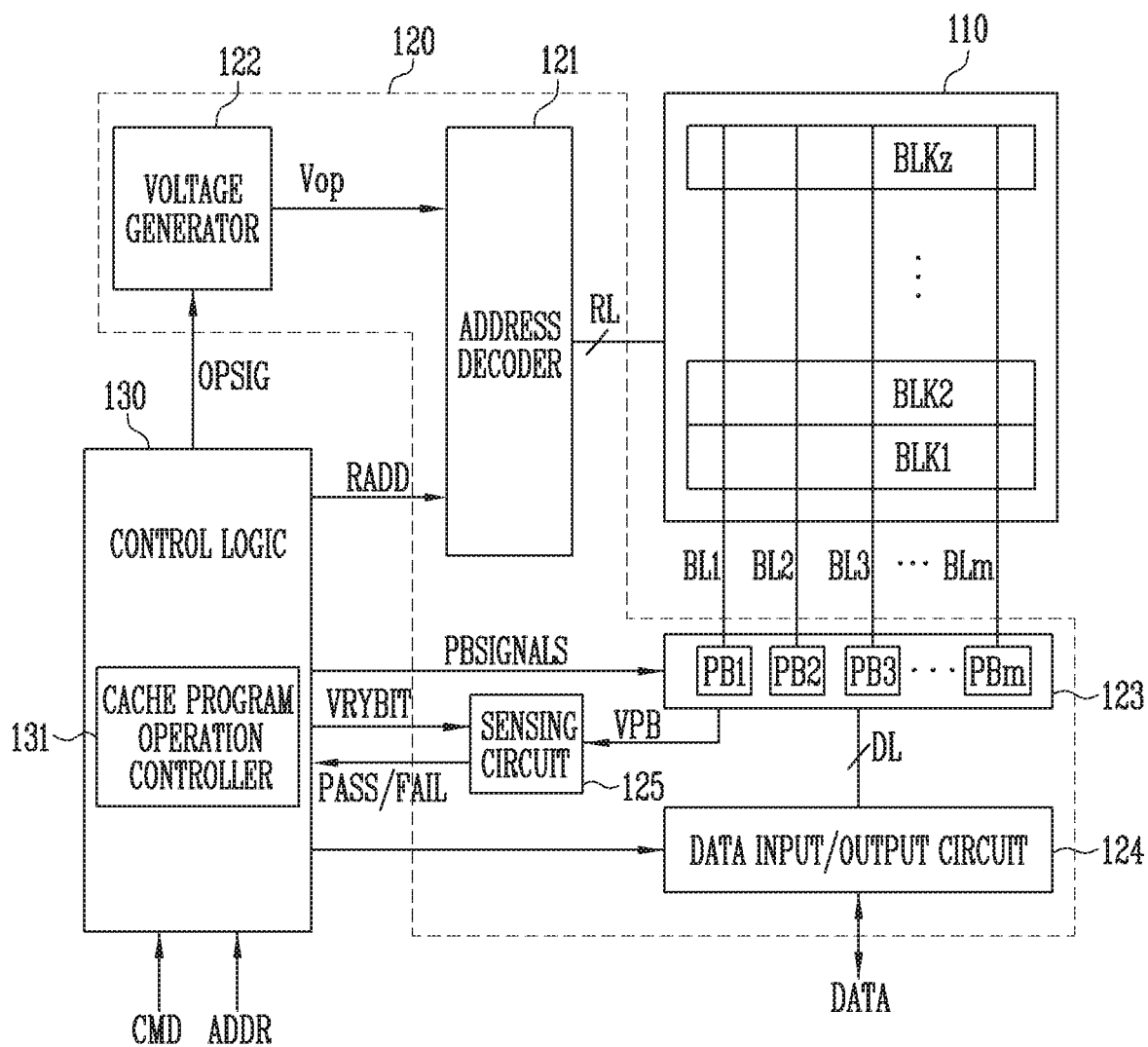
FIG. 2 is a diagram illustrating the structure of a memory device of FIG. 1.

FIG. 2 is a diagram illustrating the structure of the memory device of FIG. 1.

Referring to FIG. 2, a memory device 100 may include a memory cell array 110, a peripheral circuit 120, and a control logic 130.

The memory cell array 110 includes a plurality of memory blocks BLK1 to BLKz. The plurality of memory blocks BLK1 to BLKz are coupled to an address decoder 121 through row lines RL. The memory blocks BLK1 to BLKz are coupled to a page buffer group 123 through bit lines BL1 to BLm. Each of the memory blocks BLK1 to BLKz includes a plurality of memory cells. In an embodiment, the plurality of memory cells are nonvolatile memory cells. In the plurality of memory cells, memory cells coupled to the same word line are defined as a single page. That is, the memory cell array 110 is composed of a plurality of pages. In accordance with an embodiment of the present disclosure, each of the plurality of memory blocks BLK1 to BLKz included in the memory cell array 110 may include a plurality of dummy cells. As the dummy cells, one or more dummy cells may be coupled in series between a drain select transistor and the memory cells, and between a source select transistor and the memory cells.

Each of the memory cells of the memory device 100 may be implemented as a single-level cell (SLC) capable of storing a single data bit, a multi-level cell (MLC) capable of storing two data bits, a triple-level cell (TLC) capable of storing three data bits, or a quad-level cell (QLC) capable of storing four data bits.

The peripheral circuit 120 may include the address decoder 121, a voltage generator 122, the page buffer group 123, a data input/output circuit 124, and a sensing circuit 125.

The peripheral circuit 120 may drive the memory cell array 110. For example, the peripheral circuit 120 may drive the memory cell array 110 so that a program operation, a read operation, and an erase operation are performed.

The address decoder 121 is coupled to the memory cell array 110 through row lines RL. The row lines RL may include drain select lines, word lines, source select lines, and a common source line. In accordance with an embodiment of the present disclosure, the word lines may include normal word lines and dummy word lines. In accordance with an embodiment of the present disclosure, the row lines RL may further include a pipe select line.

The address decoder 121 may be operated under the control of the control logic 130. The address decoder 121 receives addresses ADDR from the control logic 130.

The address decoder 121 may decode a block address among the received addresses ADDR. The address decoder 121 selects at least one memory block from among the memory blocks BLK1 to BLKz in response to the decoded block address. The address decoder 121 is configured to decode a row address RADD among the received addresses ADDR. The address decoder 121 may select at least one word line of the selected memory block by applying voltages supplied from the voltage generator 122 to at least one word line WL in response to the decoded row address RADD.

During a program operation, the address decoder 121 may apply a program voltage to the selected word line and apply a pass voltage having a level lower than that of the program voltage to unselected word lines. During a program verify operation, the address decoder 121 may apply a verify voltage to a selected word line and apply a verify pass voltage having a level higher than that of the verify voltage to unselected word lines.

During a read operation, the address decoder 121 may apply a read voltage to a selected word line and apply a read pass voltage having a level higher than that of the read voltage to unselected word lines.

In accordance with an embodiment of the present disclosure, the erase operation of the memory device 100 may be performed on a memory block basis. During an erase operation, the addresses ADDR input to the memory device 100 include a block address. The address decoder 121 may decode the block address and select a single memory block in response to the decoded block address. During the erase operation, the address decoder 121 may apply a ground voltage to word lines coupled to the selected memory block.

In accordance with an embodiment of the present disclosure, the address decoder 121 may decode a column address among the received addresses ADDR. The decoded column address may be transferred to the page buffer group 123. In an embodiment, the address decoder 121 may include components such as a row decoder, a column decoder, and an address buffer.

The voltage generator 122 may generate a plurality of operating voltages Vop using an external supply voltage that is supplied to the memory device 100. The voltage generator 122 may be operated under the control of the control logic 130.

In an embodiment, the voltage generator 122 may generate an internal supply voltage by regulating the external supply voltage. The internal supply voltage generated by the voltage generator 122 is used as an operating voltage for the memory device 100.

In an embodiment, the voltage generator 122 may generate the plurality of operating voltages Vop using the external supply voltage or the internal supply voltage. The voltage generator 122 may generate various voltages required by the memory device 100. For example, the voltage generator 122 may generate a plurality of erase voltages, a plurality of program voltages, a plurality of pass voltages, a plurality of select read voltages, and a plurality of unselect read voltages.

The voltage generator 122 may include a plurality of pumping capacitors for receiving the internal supply voltage so as to generate a plurality of operating voltages Vop having various voltage levels, and may generate the plurality of operating voltages Vop by selectively enabling the plurality of pumping capacitors under the control of the control logic 130.

The generated operating voltages Vop may be supplied to the memory cell array 110 by the address decoder 121.

The page buffer group 123 includes first to m-th page buffers PB1 to PBm. The first to m-th page buffers PB1 to PBm are coupled to the memory cell array 110 through the first to m-th bit lines BL1 to BLm, respectively. The first to m-th page buffers PB1 to PBm are operated under the control of the control logic 130.

The first to m-th page buffers PB1 to PBm perform data communication with the data input/output circuit 124. During a program operation, the first to m-th page buffers PB1 to PBm receive data DATA to be stored through the data input/output circuit 124 and data lines DL.

During a program operation, the first to m-th page buffers PB1 to PBm may transfer the data DATA to be stored, received through the data input/output circuit 124, to selected memory cells through the bit lines BL1 to BLm when a program pulse is applied to a selected word line. Memory cells in a selected page are programmed based on the received data DATA. Memory cells coupled to a bit line to which a program permission voltage (e.g., a ground voltage) is applied may have increased threshold voltages. The threshold voltages of memory cells coupled to a bit line to which a program inhibit voltage (e.g., a supply voltage) is applied may be maintained. During a program verify operation, the first to m-th page buffers PB1 to PBm read the data DATA stored in the selected memory cells from the selected memory cells through the bit lines BL1 to BLm.

During a read operation, the page buffer group 123 may read data DATA from the memory cells in the selected page through the bit lines BL, and may store the read data DATA in the first to m-th page buffers PB1 to PBm.

During an erase operation, the page buffer group 123 may allow the bit lines BL to float. In an embodiment, the page buffer group 123 may include a column select circuit.

In an embodiment, while pieces of data currently stored in some of the plurality of page buffers included in the page buffer group 123 are being programmed to the memory cell array 110, the remaining page buffers may receive subsequent data from the memory controller 200 and then store the subsequent data.

The data input/output circuit 124 is coupled to the first to m-th page buffers PB1 to PBm through the data lines DL. The data input/output circuit 124 is operated in response to the control of the control logic 130.

The data input/output circuit 124 may include a plurality of input/output buffers (not illustrated) which receive input data DATA. During a program operation, the data input/output circuit 124 receives the data DATA to be stored from an external controller (not illustrated). During a read operation, the data input/output circuit 124 outputs the data DATA, received from the first to m-th page buffers PB1 to PBm included in the page buffer group 123, to the external controller.

During a read operation or a verify operation, the sensing circuit 125 may generate a reference current in response to an enable bit signal VRYBIT generated by the control logic 130, and may output a pass signal or a fail signal to the control logic 130 by comparing a sensing voltage VPB received from the page buffer group 123 with a reference voltage generated by the reference current.

The control logic 130 may be coupled to the address decoder 121, the voltage generator 122, the page buffer group 123, the data input/output circuit 124, and the sensing circuit 125. The control logic 130 may control the overall operation of the memory device 100. The control logic 130 may be operated in response to a command CMD transmitted from an external device.

The control circuit 130 may control the peripheral circuit 120 by generating various types of signals in response to the command CMD and the addresses ADDR. For example, the control logic 130 may generate an operation signal OPSIG, a row address RADD, a page buffer control signal PBSIG-NALS, and an enable bit VRYBIT in response to the command CMD and the addresses ADDR. The control logic 130 may output the operation signal OPSIG to the voltage generator 122, output the row address RADD to the address decoder 121, output the page buffer control signal PBSIG-NALS to the page buffer group 123, and output the enable bit VRYBIT to the sensing circuit 125. In addition, the control logic 130 may determine whether a verify operation has passed or failed in response to the pass or fail signal PASS or FAIL output from the sensing circuit 125.

In an embodiment, the control logic 130 may include a cache program operation controller 131.

The cache program operation controller 131 may receive a program command, an address, and data from the memory controller 200. The received data may be stored in the page buffers included in the page buffer group 123. The cache program operation controller 131 may program the received data to the memory cell array 110 in response to the program command and the address received from the memory controller 200.

In an embodiment, the cache program operation controller 131 may perform a cache program operation. The cache program operation controller 131 may program cache data chunks, currently stored in the page buffer group 123, to the memory cell array 110 while receiving subsequent cache data chunks from the memory controller 200.

In an embodiment, the cache program operation controller 131 may program each cache data chunk, stored in the page buffer group 123, to the memory cell array 110 in the sequence of LSB data to MSB data configuring each cache data chunk.

The cache program operation controller 131 may provide a status read response to the memory controller 200 in response to a status read command provided by the memory controller 200. The status read response may include ready information. The ready information may indicate whether the programming of the cache data chunks stored in the page buffer group 123 to the memory cell array 110 has been completed in response to the program command provided by the memory controller 200.

Figure 3:
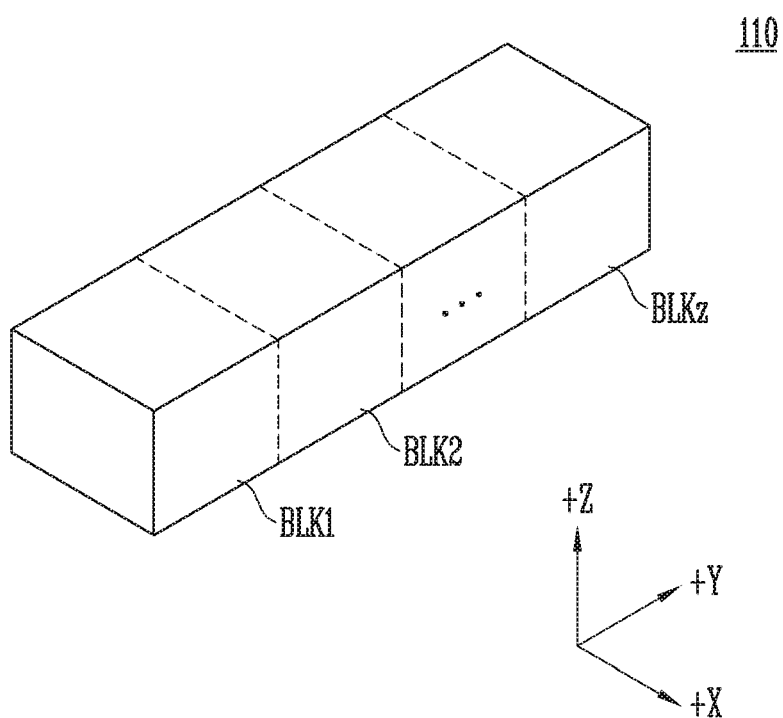
FIG. 3 is a diagram illustrating an embodiment of a memory cell array of FIG. 2.

FIG. 3 is a diagram illustrating an embodiment of the memory cell array of FIG. 2.

Referring to FIG. 3, the memory cell array 110 includes a plurality of memory blocks BLK1 to BLKz. Each memory block may have a three-dimensional (3D) structure. Each memory block includes a plurality of memory cells stacked on a substrate. Such memory cells are arranged in a positive X (+X) direction, a positive Y (+Y) direction, and a positive Z (+Z) direction. The structure of each memory block will be described in detail below with reference to FIGS. 4 and 5.

Figure 4:
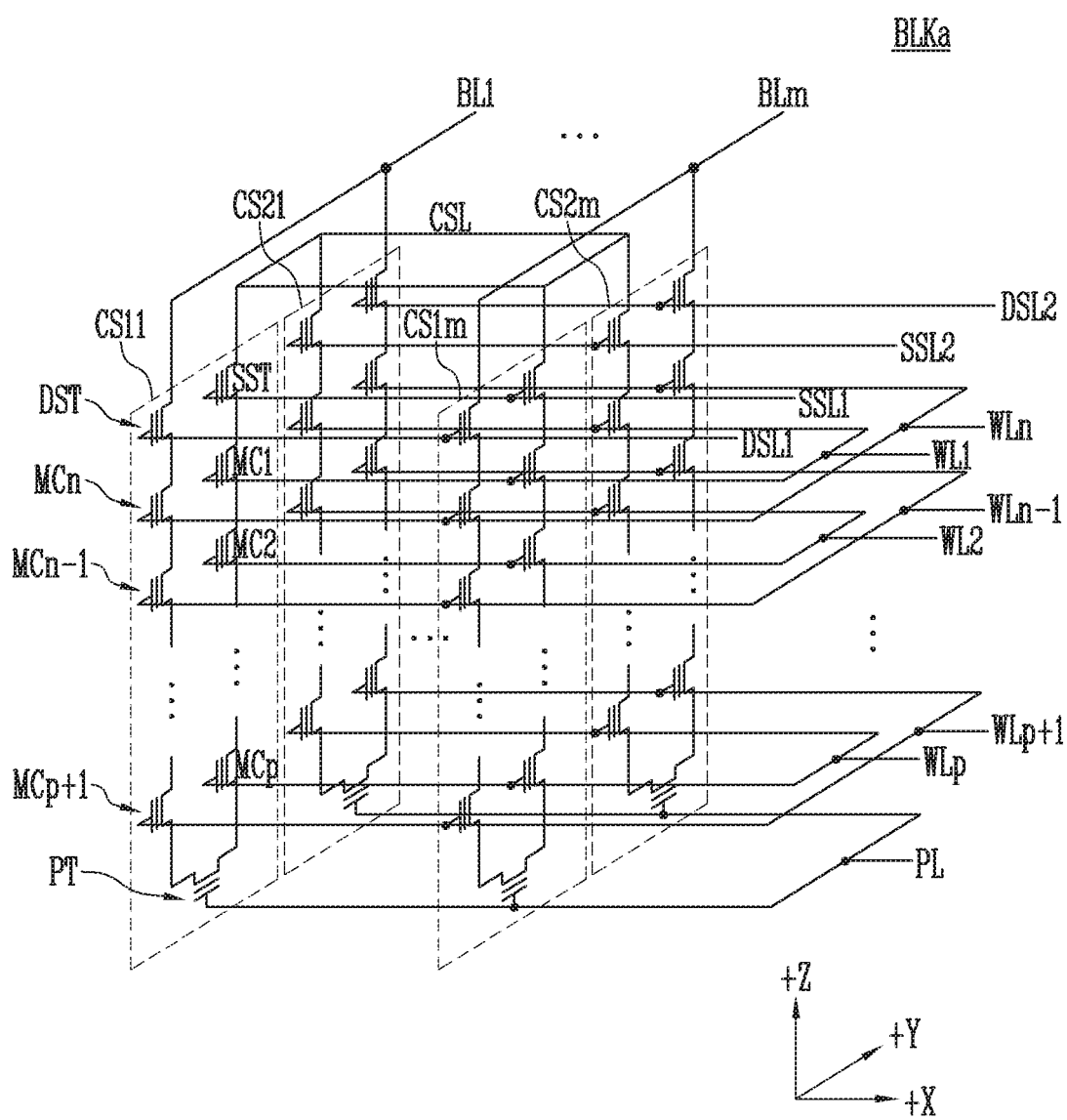
FIG. 4 is a circuit diagram illustrating any one memory block BLKa of memory blocks BLK1 to BLKz of FIG. 3.

FIG. 4 is a circuit diagram illustrating any one memory block BLKa of the memory blocks BLK1 to BLKz of FIG. 3.

Referring to FIG. 4, the memory block BLKa includes a plurality of cell strings CS11 to CS1*m* and CS21 to CS2*m*. In an embodiment, each of the cell strings CS11 to CS1*m* and CS21 to CS2*m* may be formed in a 'U' shape. In the memory block BLKa, m cell strings are arranged in a row direction (i.e. a positive (+) X direction). In FIG. 4, two cell strings are illustrated as being arranged in a column direction (i.e. a positive (+) Y direction). However, this illustration is made for convenience of description, and it will be understood that three or more cell strings may be arranged in the column direction.

Each of the plurality of cell strings CS11 to CS1*m* and CS21 to CS2*m* includes at least one source select transistor SST, first to n-th memory cells MC1 to MCn, a pipe transistor PT, and at least one drain select transistor DST.

The select transistors SST and DST and the memory cells MC1 to MCn may have similar structures, respectively. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided to each cell string. In an embodiment, a pillar for providing at least one of the channel layer, the tunneling insulating layer, the charge storage layer, and the blocking insulating layer may be provided to each cell string.

The source select transistor SST of each cell string is connected between the common source line CSL and memory cells MC1 to MCp.

In an embodiment, the source select transistors of cell strings arranged in the same row are coupled to a source select line extending in a row direction, and source select transistors of cell strings arranged in different rows are coupled to different source select lines. In FIG. 4, source select transistors of cell strings CS11 to CS1*m* in a first row are coupled to a first source select line SSL1. The source select transistors of cell strings CS21 to CS2*m* in a second row are coupled to a second source select line SSL2.

In an embodiment, source select transistors of the cell strings CS11 to CS1*m* and CS21 to CS2*m* may be coupled in common to a single source select line.

The first to n-th memory cells MC1 to MCn in each cell string are coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp are sequentially arranged in a direction opposite a positive (+) Z direction and are connected in series between the source select transistor SST and the pipe transistor PT. The p+1-th to n-th memory cells MCp+1 to MCn are sequentially arranged in the +Z direction and are connected in series between the pipe transistor PT and the drain select transistor DST. The first to p-th memory cells MC1 to MCp and the p+1-th to n-th memory cells MCp+1 to MCn are coupled to each other through the pipe transistor PT. The gates of the first to n-th memory cells MC1 to MCn of each cell string are coupled to first to n-th word lines WL1 to WLn, respectively.

A gate of the pipe transistor PT of each cell string is coupled to a pipeline PL.

The drain select transistor DST of each cell string is coupled between the corresponding bit line and the memory cells MCp+1 to MCn. The cell strings in a row direction are coupled to drain select lines extending in a row direction. Drain select transistors of cell strings CS11 to CS1*m* in the first row are coupled to a first drain select line DSL1. Drain select transistors of cell strings CS21 to CS2*m* in a second row are coupled to a second drain select line DSL2.

Cell strings arranged in a column direction are coupled to bit lines extending in a column direction. In FIG. 4, cell strings CS11 and CS21 in a first column are coupled to a first bit line BL1. Cell strings CS1*m* and CS2*m* in an m-th column are coupled to an m-th bit line BLm.

The memory cells coupled to the same word line in cell strings arranged in a row direction constitute a single page. For example, memory cells coupled to the first word line WL1, among the cell strings CS11 to CS1*m* in the first row, constitute a single page. Memory cells coupled to the first word line WL1, among the cell strings CS21 to CS2*m* in the second row, constitute a single additional page. Cell strings arranged in the direction of a single row may be selected by selecting any one of the drain select lines DSL1 and DSL2.

A single page may be selected from the selected cell strings by selecting any one of the word lines WL1 to WLn.

In an embodiment, even bit lines and odd bit lines, instead of first to m-th bit lines BL1 to BLm, may be provided. Further, even-numbered cell strings, among the cell strings CS11 to CS1m or CS21 to CS2m arranged in a row direction, may be coupled to the even bit lines, respectively, and odd-numbered cell strings, among the cell strings CS11 to CS1m or CS21 to CS2m arranged in the row direction, may be coupled to the odd bit lines, respectively.

In an embodiment, one or more of the first to n-th memory cells MC1 to MCn may be used as dummy memory cells. For example, one or more dummy memory cells are provided to reduce an electric field between the source select transistor SST and the memory cells MC1 to MCp. Alternatively, the one or more dummy memory cells are provided to reduce an electric field between the drain select transistor DST and the memory cells MCp+1 to MCn. As more dummy memory cells are provided, the reliability of the operation of the memory block BLKa is improved, but the size of the memory block BLKa is increased. As fewer dummy memory cells are provided, the size of the memory block BLKa is reduced, but the reliability of the operation of the memory block BLKa may be deteriorated.

In order to efficiently control the one or more dummy memory cells, each of the dummy memory cells may have a required threshold voltage. Before or after the erase operation of the memory block BLKa is performed, a program operation may be performed on all or some of the dummy memory cells. When an erase operation is performed after the program operation has been performed, the voltages applied to the dummy word lines coupled to respective dummy memory cells may be controlled, and thus the dummy memory cells may have required threshold voltages.

Figure 5:
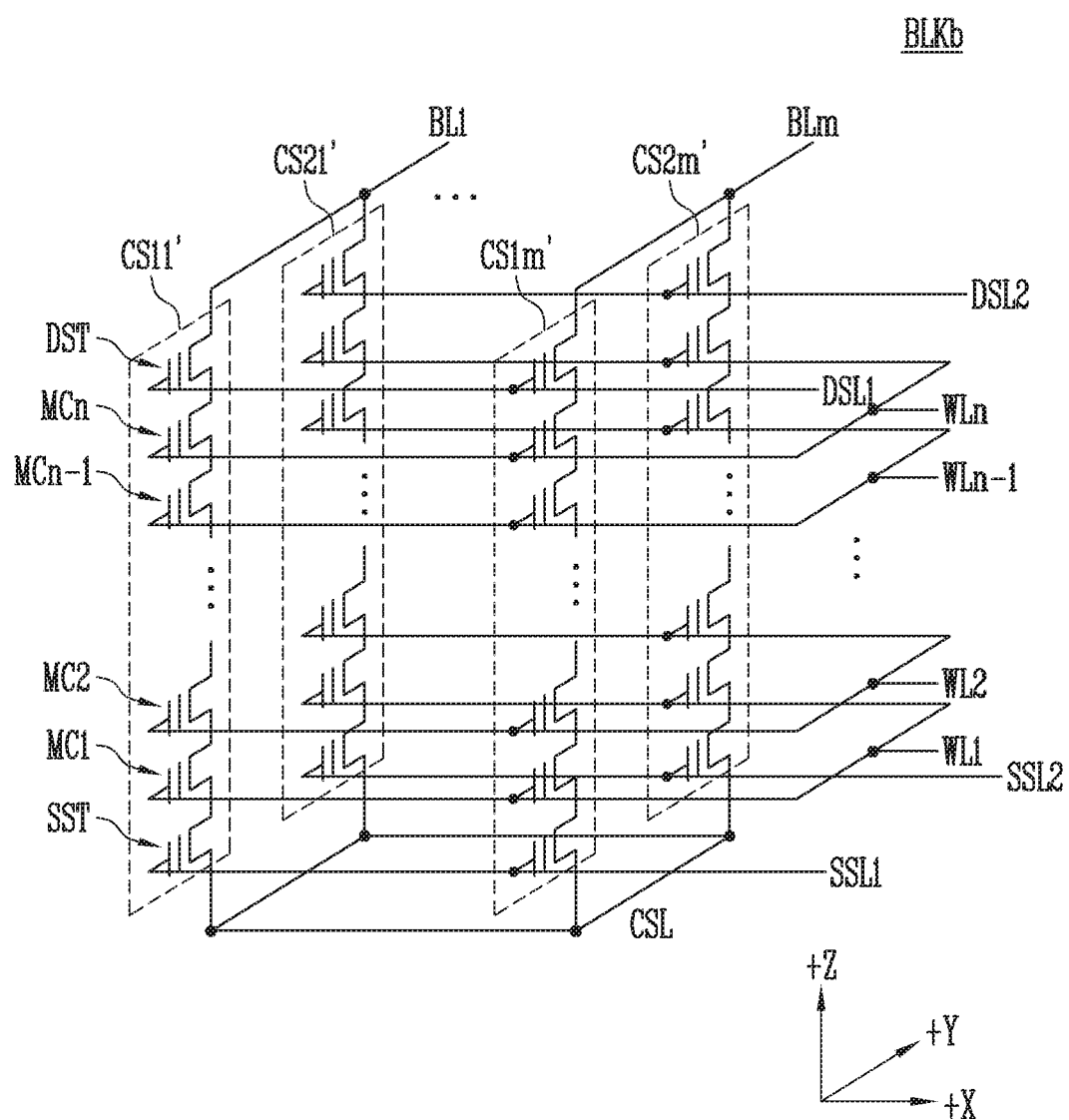
FIG. 5 is a circuit diagram illustrating an example of any one memory block BLKb of the memory blocks BLK1 to BLKz of FIG. 3.

FIG. 5 is a circuit diagram illustrating an example of any one memory block BLKb of the memory blocks BLK1 to BLKz of FIG. 3.

Referring to FIG. 5, the memory block BLKb includes a plurality of cell strings CS11' to CS1m' and CS21' to CS2m'. Each of the plurality of cell strings CS11' to CS1m' and CS21' to CS2m' extends in a positive Z (+Z) direction. Each of the cell strings CS11' to CS1m' and CS21' to CS2m' includes at least one source select transistor SST, first to n-th memory cells MC1 to MCn, and at least one drain select transistor DST, which are stacked on a substrate (not illustrated) below the memory block BLKb.

The source select transistor SST of each cell string is connected between a common source line CSL and memory cells MC1 to MCn. The source select transistors of cell strings arranged in the same row are coupled to the same source select line. Source select transistors of cell strings CS11' to CS1m' arranged in a first row are coupled to a first source select line SSL1. Source select transistors of cell strings CS21' to CS2m' arranged in a second row are coupled to a second source select line SSL2. In an embodiment, source select transistors of the cell strings CS11' to CS1m' and CS21' to CS2m' may be coupled in common to a single source select line.

The first to n-th memory cells MC1 to MCn in each cell string are connected in series between the source select transistor SST and the drain select transistor DST. The gates of the first to n-th memory cells MC1 to MCn are coupled to first to n-th word lines WL1 to WLn, respectively.

The drain select transistor DST of each cell string is connected between the corresponding bit line and the memory cells MC1 to MCn. Drain select transistors of cell strings arranged in a row direction are coupled to drain select lines extending in a row direction. The drain select transistors of the cell strings CS11' to CS1m' in the first row are coupled to a first drain select line DSL1. The drain select transistors of the cell strings CS21' to CS2m' in the second row are coupled to a second drain select line DSL2.

As a result, the memory block BLKb of FIG. 5 has an equivalent circuit similar to that of the memory block BLKa of FIG. 4 except that a pipe transistor PT is excluded from each cell string.

In an embodiment, even bit lines and odd bit lines, instead of first to m-th bit lines BL1 to BLm, may be provided. Further, even-numbered cell strings, among the cell strings CS11' to CS1m' or CS21' to CS2m' arranged in a row direction, may be coupled to the even bit lines, respectively, and odd-numbered cell strings, among the cell strings CS11' to CS1m' or CS21' to CS2m' arranged in the row direction, may be coupled to the odd bit lines, respectively.

In an embodiment, one or more of the first to n-th memory cells MC1 to MCn may be used as dummy memory cells. For example, the one or more dummy memory cells are provided to reduce an electric field between the source select transistor SST and the memory cells MC1 to MCn. Alternatively, the one or more dummy memory cells are provided to reduce an electric field between the drain select transistor DST and the memory cells MC1 to MCn. As more dummy memory cells are provided, the reliability of the operation of the memory block BLKb is improved, but the size of the memory block BLKb is increased. As fewer dummy memory cells are provided, the size of the memory block BLKb is reduced, but the reliability of the operation of the memory block BLKb may be deteriorated.

In order to efficiently control the one or more dummy memory cells, each of the dummy memory cells may have a required threshold voltage. Before or after the erase operation of the memory block BLKb is performed, a program operation may be performed on all or some of the dummy memory cells. When an erase operation is performed after the program operation has been performed, the voltages applied to the dummy word lines coupled to respective dummy memory cells may be controlled, and thus the dummy memory cells may have required threshold voltages.

Figure 6:
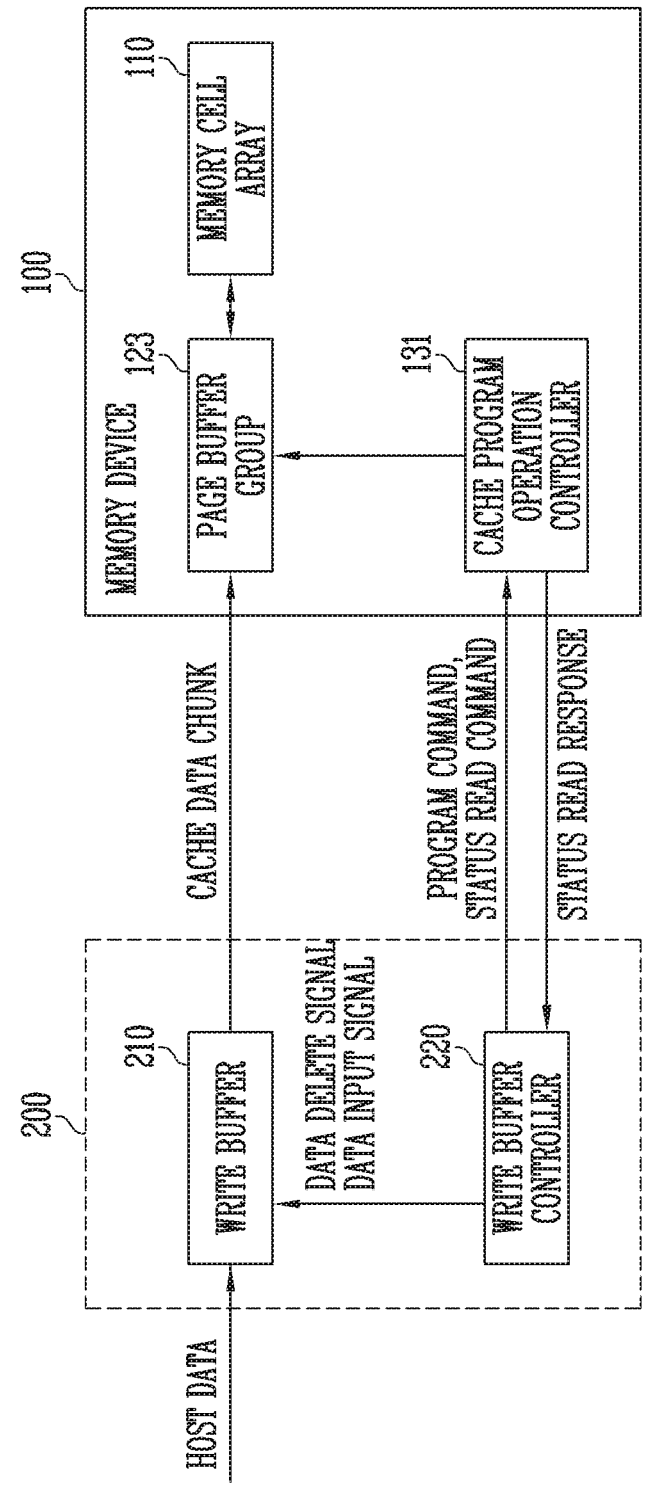
FIG. 6 is a diagram illustrating the operation of a memory device and a memory controller in accordance with an embodiment.

FIG. 6 is a diagram illustrating the operation of the memory device 100 and the memory controller 200 in accordance with an embodiment.

Referring to FIG. 6, the memory device 100 may include the memory cell array 110, the page buffer group 123, and the cache program operation controller 131. The cache program operation may be implemented with a processor, a firmware, or a circuitry configured to perform the cache program operation.

The memory cell array 110 may include a plurality of memory cells which store data. The memory cell array 110 may be electrically coupled to the page buffer group 123. The data stored in the page buffers included in the page buffer group 123 may be programmed to the memory cell array 110.

The plurality of page buffers included in the page buffer group 123 may store a plurality of cache data chunks received from the write buffer 210. The cache data chunks stored in the plurality of page buffers may be programmed to the memory cell array 110. While current cache data chunks stored in some of the plurality of page buffers are being programmed to the memory cell array 110, the remaining page buffers may receive subsequent data from the write buffer 210 and then store the subsequent data.

The cache program operation controller 131 may program the cache data chunks stored in the page buffer group 123 to the memory cell array 110 under the control of the write buffer controller 220. The cache program operation controller 131 may program each cache data chunk to the memory cell array 110 in the sequence of LSB data to MSB data configuring each cache data chunk.

The cache program operation controller 131 may provide a status read response to the write buffer controller 220 in response to a status read command provided by the write buffer controller 220. The status read response may include ready information. The ready information may indicate a status ready for a subsequent command due to completion of an operation for a current command. For example, the ready information may indicate whether the programming of each cache data chunk, stored in the page buffer group 123, to the memory cell array 110 has been completed in response to a program command provided by the write buffer controller 220.

In FIG. 6, the memory controller 200 may include the write buffer 210 and the write buffer controller 220.

The write buffer 210 may store received host data in units of cache data chunks. The write buffer 210 may provide the cache data chunks to the page buffer group 123 in response to a data input signal provided by the write buffer controller 220. The write buffer 210 may delete cache data chunks therefrom in response to a data delete signal provided by the write buffer controller 220.

The plurality of cache data chunks may be sequentially provided from the write buffer 210 to the memory device 100 in a preset sequence. The cache data chunks provided to the memory device 100 may be stored in the page buffer group 123. The cache data chunks stored in the page buffer group 123 may be programmed to the memory cell array 110.

The write buffer controller 220 may sequentially provide the plurality of cache data chunks from the write buffer 210 to the page buffer group 123. In detail, the write buffer controller 220 may generate a data input signal and provide it to the write buffer 210. The data input signal may control the write buffer 210 to provide the cache data chunks stored therein to the page buffer group 123.

The write buffer controller 220 may provide a program command for the cache data chunks to the cache program operation controller 131 while providing the cache data chunks to the page buffer group 123.

The write buffer controller 220 may control the write buffer 210 so that a cache program operation is performed on the cache data chunks stored in the write buffer 210. In detail, the write buffer controller 220 may provide a subsequent cache data chunk to the page buffer group 123 while a current cache data chunk is being programmed to the memory cell array 110. That is, the write buffer controller 220 may provide a data input signal for a subsequent cache data chunk to the write buffer 210 while the current cache data chunk is being programmed to the memory cell array 110.

The write buffer controller 220 may determine a time point at which each cache data chunk stored in the write buffer 210 is to be provided to the page buffer group 123.

In an embodiment, the write buffer controller 220 may provide the cache data chunk to the page buffer group 123. When a preset time has elapsed, the write buffer controller 220 may provide a subsequent cache data chunk to the page buffer group 123. That is, when the preset time has elapsed, the write buffer controller 220 may apply the data input signal for the subsequent cache data chunk to the write buffer 210. The preset time may be a time point at which the programming of LSB data of the provided current cache data chunk to the memory cell array is completed.

The write buffer controller 220 may delete the cache data chunk, which has been programmed to the memory cell array 110, from the write buffer 210. In detail, the write buffer controller 220 may provide the write buffer 210 with a data delete signal for requesting the deletion of the cache data chunk which has been programmed to the memory cell array 110. A storage area of the write buffer 210 in which the deleted cache data chunk was stored may receive and store subsequent host data.

In an embodiment, the write buffer controller 220 may determine a time point at which the data delete signal is to be provided to the write buffer 210. When the programming of host data, provided to the page buffer group 123, to the memory cell array 110 has been completed, the write buffer controller 220 may provide the data delete signal to the write buffer 210.

The write buffer controller 220 may provide a status read command to the cache program operation controller 131. The status read command may be a command for determining whether the programming of data stored in the write buffer 210 to the memory cell array 110 has been completed.

The write buffer controller 220 may provide the status read command to the cache program operation controller 131, and may acquire a status read response from the cache program operation controller 131. The write buffer controller 220 may determine, based on ready information included in the status read response, a time point at which the programming of each cache data chunk to the memory cell array 110 is completed. The ready information may indicate whether the programming of the host data, stored in the page buffer group 123, to the memory cell array 110 has been completed in response to the program command provided by the write buffer controller 220.

Figure 7:
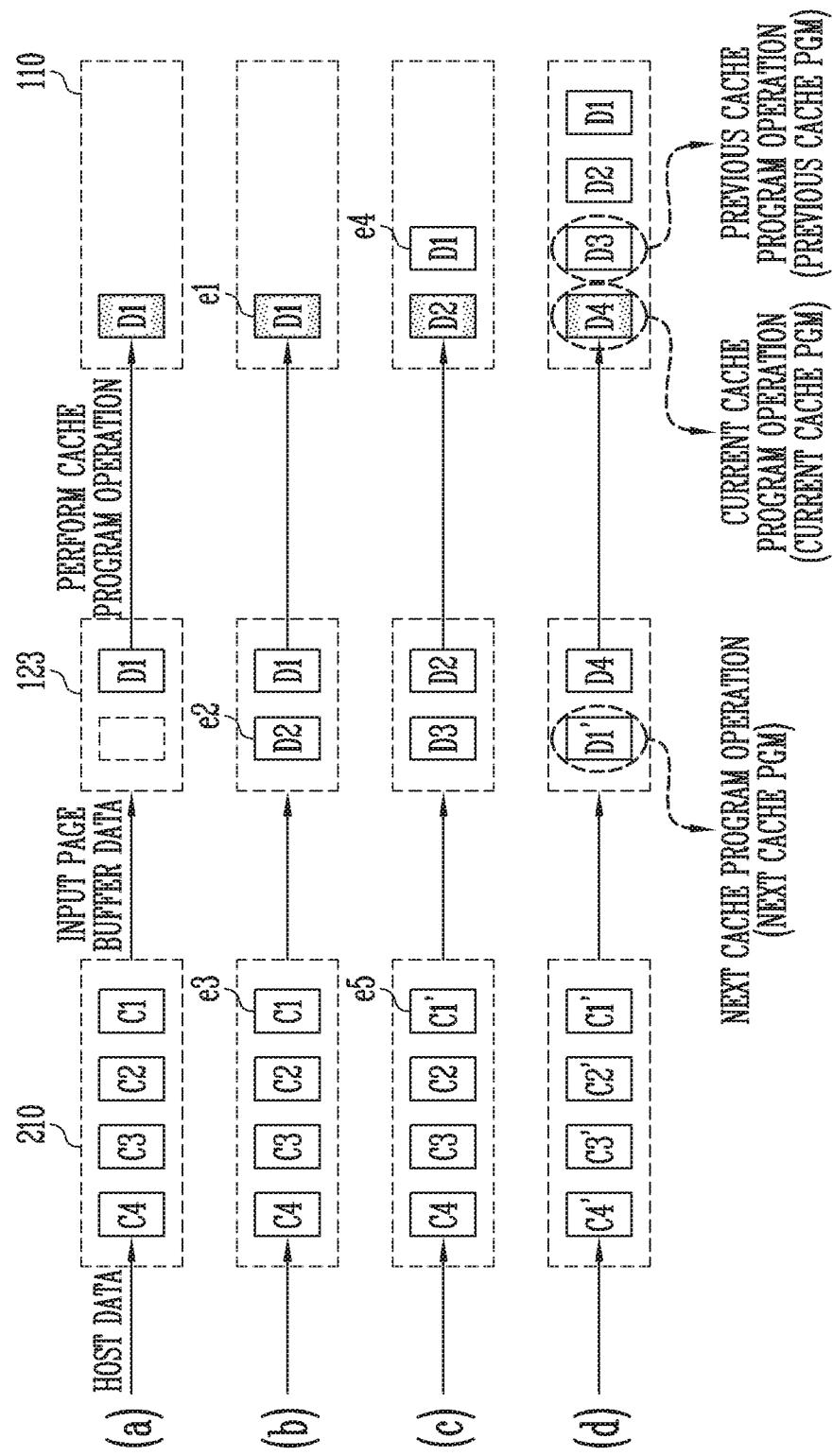
FIG. 7 is a diagram describing an operation of deleting a cache data chunk stored in a write buffer and an operation of inputting a cache data chunk to a page buffer.

FIG. 7 is a diagram describing an operation of deleting a cache data chunk stored in the write buffer 210 and an operation of inputting a cache data chunk to a page buffer.

Referring to FIG. 7, host data may be sequentially input to and stored in units of cache data chunks in the write buffer 210. The plurality of cache data chunks stored in the write buffer 210 may be input to the page buffer group 123. The cache data chunks input to and stored in the page buffer group 123 may be programmed to the memory cell array 110. Each cache data chunk which has been programmed to the memory cell array 110 may be deleted from the write buffer 210. A storage area of the write buffer 210 in which the deleted cache data chunk was stored may receive and store subsequent host data.

Each cache data chunk stored in the write buffer 210 may be input to the page buffer group 123. Each cache data chunk input to the page buffer group 123 may be a page buffer data chunk. The page buffer data chunk may be data identical to the cache data chunk.

In figure FIG. 7 reference line (a), the write buffer 210 may receive and store host data. The write buffer 210 may store first to fourth cache data chunks C1 to C4 configuring the host data. The first cache data chunk C1 may be input to and stored in the page buffer group 123. The first cache data chunk C1 input to the page buffer group 123 may be data identical to a first page buffer data chunk D1 stored in the page buffer group 123. The first page buffer data chunk D1 stored in the page buffer group 123 may be programmed to the memory cell array 110.

Among page buffer data chunks illustrated in the memory cell array 110, each page buffer data chunk indicated as a shaded portion may be data that is being programmed. Page buffer data chunks that are not indicated as a shaded portion may be data that has been programmed. Therefore, the first page buffer data chunk D1 indicated as a shaded portion in the memory cell array 110 may be data that is being programmed.

In FIG. 7 reference line (b), the first page buffer data chunk D1 (e1) may be data that is being programmed to the memory cell array 110. While the first page buffer data chunk D1 (e1) is being programmed, the second cache data chunk C2 may be input to and stored in the page buffer group 123. A second page buffer data chunk D2 (e2) may be programmed to the memory cell array 110 if the programming of the first page buffer data chunk D1 (e1) has been completed.

In FIG. 7 reference line (c), the first page buffer data chunk D1 (e4) may be data, programming of which to the memory cell array 110 has been completed. Therefore, referring to FIG. 7 reference line (b), the first cache data chunk C1 (e3) that has been programmed to the memory cell array 110 may be deleted from the write buffer 210.

A storage area of the write buffer 210 in which the deleted first cache data chunk C1 (e3) was stored may receive and store subsequent host data. The storage area of the write buffer 210 may store subsequent first cache data chunk C1' (e5).

Through a process described in FIG. 7 reference lines (a) to (c), the host data may be input to and stored in the write buffer 210, and the host data stored in the write buffer 210 may be input to the page buffer group 123 and then programmed to the memory cell array 110. Here, a cache program operation on the host data may be performed, with the host data configured by a plurality of cache data chunks.

In FIG. 7 reference line (d), the write buffer 210 may store first to fourth cache data chunks C1' to C4' configuring the input host data.

In the memory cell array 110, the first to third page buffer data chunks D1 to D3 may be data that has been programmed to the memory cell array 110. A fourth page buffer data chunk D4 may be data that is being programmed to the memory cell array 110.

Therefore, the fourth page buffer data chunk D4 may be data that is being programmed by a current cache program operation (Current Cache PGM). The third page buffer data chunk D3 may be data that has been programmed by a previous cache program operation (Previous Cache PGM). A subsequent first page buffer data chunk D1' may be data that is to be programmed by a subsequent cache program operation (Next Cache PGM).

Figure 8:
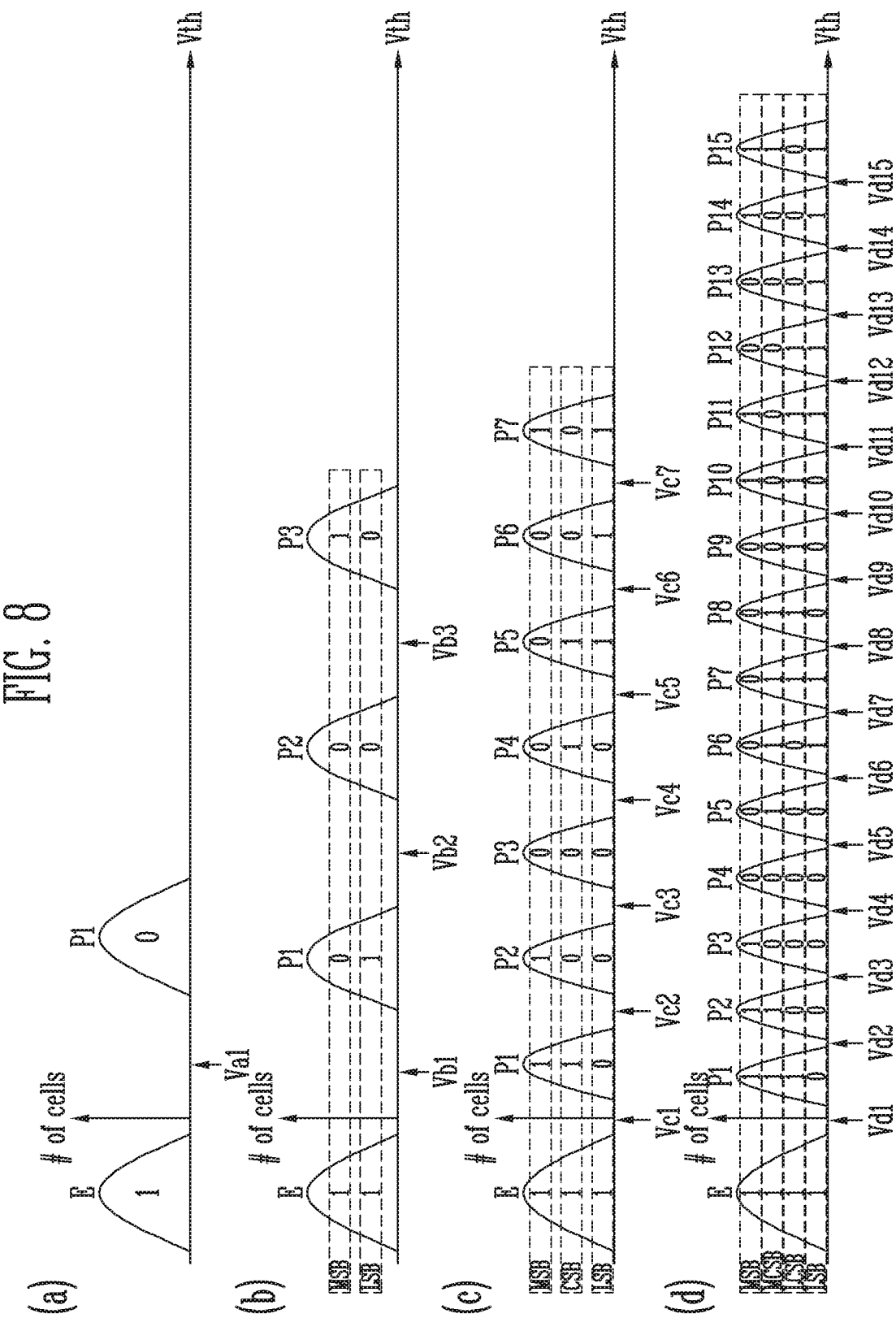
FIG. 8 is a diagram describing threshold voltage distributions of memory cells which store at least one data bit.

FIG. 8 is a diagram describing threshold voltage distributions of memory cells which store at least one data bit.

Referring to FIG. 8, a horizontal axis of each graph denotes the magnitude of a threshold voltage and a vertical axis thereof denotes the number of memory cells.

Graphs in reference lines (a) to (d) will be described on the assumption that the number of data bits stored in one memory cell ranges from 1 to 4. However, the number of data bits stored in one memory cell is not limited to the present embodiment.

The graph in reference line (a) shows a threshold voltage distribution of a single-level cell (SLC) in which one memory cell stores one data bit. The single-level cell may have a state corresponding to any one of an erased state E and a programmed state P1.

A read voltage Va1 may be a read voltage for distinguishing the erased state E from the programmed state P1. When the single-level cell having the erased state E is read using the read voltage Va1, it may be read as an ON cell. The ON cell may correspond to a logical value of '1'. When the single-level cell having the programmed state P1 is read using the read voltage Va1, it may be read as an OFF cell. The OFF cell may correspond to a logical value of '0'.

The graph in reference line (b) shows a multi-level cell (MLC) in which one memory cell stores two data bits. The multi-level cell may have a state corresponding to an erased state E or any one of first to third programmed states P1 to P3.

First to third read voltages Vb1 to Vb3 may be read voltages for distinguishing the erased state E and the first to third programmed states P1 to P3 from each other. The first read voltage Vb1 may be a read voltage for distinguishing the erased state E from the first programmed state P1. The second read voltage Vb2 may be a read voltage for distinguishing the first programmed state P1 from the second programmed state P2. The third read voltage Vb3 may be a read voltage for distinguishing the second programmed state P2 from the third programmed state P3.

The multi-level cell may be identified as being in a state corresponding to the erased state E or any one of the first to third programmed states P1 to P3 based on the result of reading using the first to third read voltages Vb1 to Vb3.

The erased state E and the first to third programmed states P1 to P3 may correspond to pieces of logical data '11', '01', '00', and '10', respectively. The pieces of logical data corresponding to respective states are not limited to the present embodiment.

A page in which an MSB of two bits stored in the multi-level cell is stored may be a Most Significant Bit (MSB) page. A page in which a Least Significant Bit (LSB) of two bits stored in the multi-level cell is stored may be an LSB page. When data is programmed to the multi-level cell, LSB page data is programmed, after which MSB page data may be programmed.

The graph in reference line (c) shows a triple-level cell (TLC) in which one memory cell stores three data bits. The triple-level cell may have a state corresponding to an erased state E or any one of first to seventh programmed states P1 to P7.

First to seventh read voltages Vc1 to Vc7 may be read voltages for distinguishing the erased state E and the first to seventh programmed states P1 to P7 from each other. The first read voltage Vc1 may be a read voltage for distinguishing the erased state E from the first programmed state P1. The second read voltage Vc2 may be a read voltage for distinguishing the first programmed state P1 from the second programmed state P2. In a similar way, the seventh read voltage Vc7 may be a read voltage for distinguishing the sixth programmed state P6 from the seventh programmed state P7.

The triple-level cell may be identified as being in a state corresponding to the erased state E or any one of the first to seventh programmed states P1 to P7 based on the result of reading using the first to seventh read voltages Vc1 to Vc7.

The erased state E and the first to seventh programmed states P1 to P7 may correspond to pieces of logical data '111', '110', '100', '000', '010', '011', '001', and '101', respectively. The pieces of logical data corresponding to respective states are not limited to the present embodiment.

A page in which an MSB of three bits stored in the triple-level cell is stored may be an MSB page. A page in which a central bit of the three bits is stored may be a Central Significant Bit (CSB) page. A page in which an LSB of the three bits is stored may be an LSB page. When data is programmed to a triple-level cell, the data may be programmed in the sequence of LSB page data, CSB page data, and MSB page data.

The graph in reference line (d) shows a quad-level cell (QLC) in which one memory cell stores four data bits. The quad-level cell may have a state corresponding to an erased state E or any one of first to 15-th programmed states P1 to P15.

The first to 15-th read voltages Vd1 to Vd15 may be read voltages for distinguishing the erased state E and the first to 15-th programmed states P1 to P15 from each other. The first read voltage Vd1 may be a read voltage for distinguishing the erased state E from the first programmed state P1. The second read voltage Vd2 may be a read voltage for distinguishing the first programmed state P1 from the second programmed state P2. In a similar way, the 15-th read voltage Vd15 may be a read voltage for distinguishing the 14-th programmed state P14 from the 15-th programmed state P15.

The quad-level cell may be identified as being in a state corresponding to the erased state E or any one of the first to 15-th programmed states P1 to P15 based on the result of reading using the first to 15-th read voltages Vd1 to Vd15.

The erased state E and the first to 15-th programmed states P1 to P15 may correspond to pieces of logical data '1111', '1110', '1100', '1000', '0000', '0100', '0101', '0111', '0110', '0010', '1010', '1011', '0011', '0001', '1001' and '1101', respectively. The pieces of logical data corresponding to respective states are not limited to the present embodiment.

A page in which an MSB of four bits stored in the quad-level cell is stored may be an MSB page. A page in which a second most significant bit of the four bits is stored may be a Most Central Significant Bit (MCSB) page. A page in which a second least significant bit of the four bits is stored may be a Least Central Significant Bit (LCSB) page. A page in which an LSB of the four bits is stored may be an LSB page. When data is programmed to the quad-level cell, the data may be programmed in the sequence of LSB page data, LCSB page data, MCSB page data, and MSB page data.

When the graphs in reference lines (a) to (d) are compared with each other, as the number of data bits stored in one memory cell is increased, the number of programmed states that can be represented by one memory cell and the number of read voltages for distinguishing individual programmed states may be increased. As the number of programmed states that can be represented by one memory cell is increased, the total width of a range in which threshold voltage distributions corresponding to respective programmed states are located may be increased. In contrast, as the number of programmed states that can be represented by one memory cell is increased, the width of a threshold voltage distribution corresponding to each programmed state may be decreased.

Figure 9:
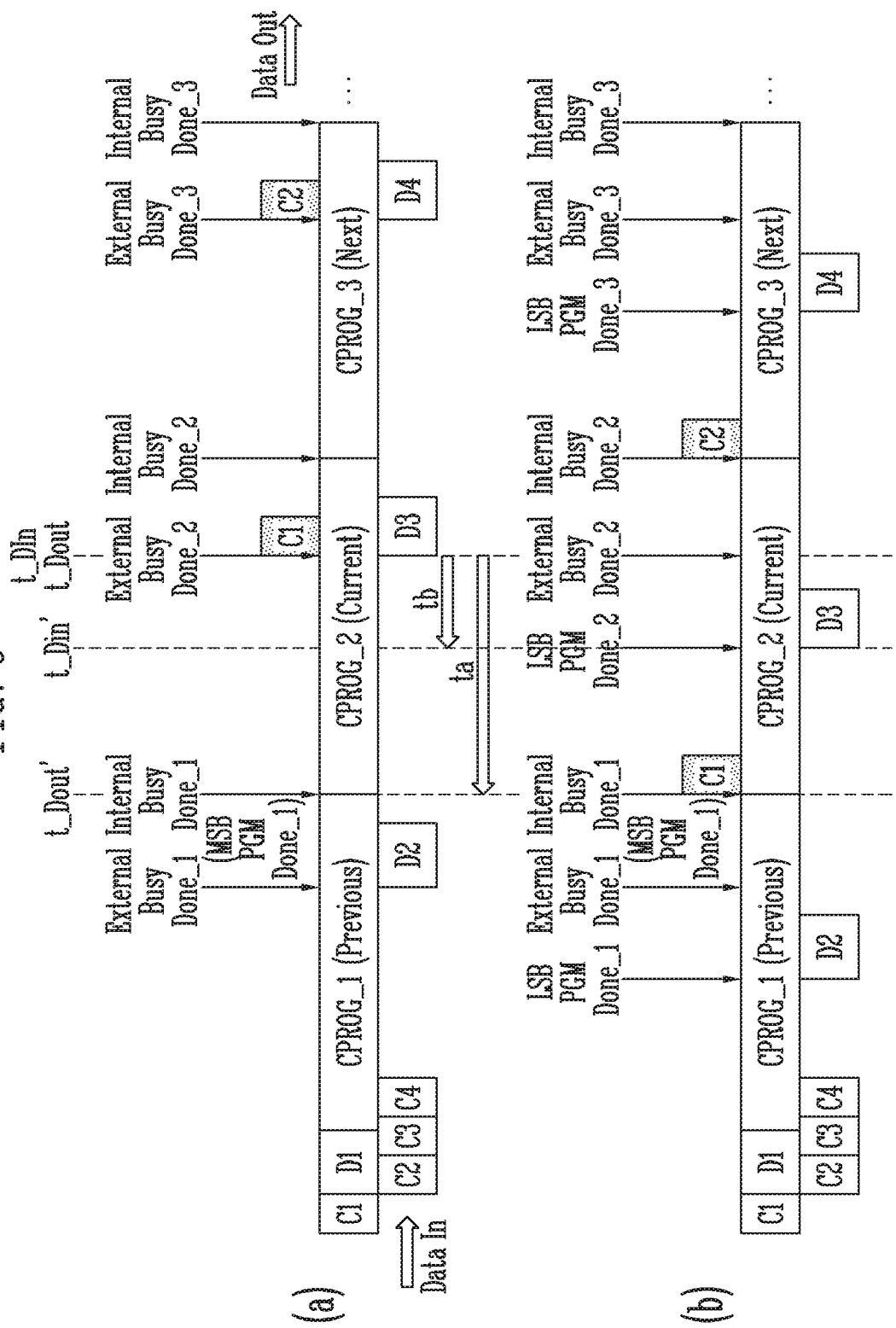
FIG. 9 is a diagram illustrating a cache program operation in accordance with an embodiment.

FIG. 9 is a diagram illustrating a program operation in accordance with an embodiment.

Referring to FIG. 9, first to fourth cache data chunks C1 to C4 may be pieces of data stored in the write buffer 210, described above with reference to FIG. 7. First to fourth page buffer data chunks D1 to D4 may be pieces of data obtained when the first to fourth cache data chunks C1 to C4 are input to and stored in a page buffer. Cache data chunks indicated as shaded portions may be cache data chunks deleted from the write buffer 210.

An internal operation completion time point ("Internal Busy Done") may be a time point at which the programming of each cache data chunk, input to a page buffer group, to a memory cell array is completed. An external operation completion time ("External Busy Done") may be a time point at which the programming of MSB data of each cache data chunk, input to the page buffer group, to the memory cell array is completed. Here, the MSB data may be data corresponding to an MSB of three bits stored in a triple-level cell (TLC). In an embodiment, the MSB data may be data corresponding to an MSB of four bits stored in a quad-level cell (QLC).

FIG. 9 reference line (a) illustrates a cache program operation.

In figure FIG. 9 reference line (a), the second page buffer data chunk D2 may be data that is being programmed by a current cache program operation. The first page buffer data chunk D1 may be data programmed by a previous cache program operation. The third page buffer data chunk D3 may be data to be programmed by a next cache program operation.

A time point at which the first cache data chunk C1 programmed by the previous cache program operation is deleted from the write buffer will be described based on the second page buffer data chunk D2 that is being programmed by the current cache program operation. Similarly, a time point at which the third page buffer data chunk D3 to be programmed by the next cache program operation is input to the page buffer group will be described below.

The first cache data chunk C1 may be deleted from the write buffer at a second external operation completion time point (External Busy Done_2). The second external operation completion time point (External Busy Done_2) may be a time point at which the programming of MSB data of the second page buffer data chunk D2 that is currently being programmed is completed. The third page buffer data chunk D3 may be input to and stored in the page buffer group at the second external operation completion time point (External Busy Done_2).

FIG. 9 reference line (b) illustrates a cache program operation in accordance with an embodiment of the present disclosure.

A first cache data chunk C1 may be deleted from the write buffer 210 at a first internal operation completion time point (Internal Busy Done_1). The first internal operation completion time point (Internal Busy Done_1) may be a time point at which the programming of a first page buffer data chunk D1 is completed by a previous cache program operation.

A third page buffer data chunk D3 may be input to and stored in the page buffer group 123 at a second data chunk LSB program completion time point (LSB PGM Done_2). The second data chunk LSB program completion time point (LSB PGM Done_2) may be a time point at which LSB data of a second page buffer data chunk D2 that is currently being programmed is completed. Here, the LSB data may be data corresponding to an LSB of three bits stored in a triple-level cell (TLC). In an embodiment, the LSB data may be data corresponding to an LSB of four bits stored in a quad-level cell (QLC).

Comparing figure FIG. 9 reference line (a) to reference line (b) shows that the time point at which the first cache data chunk C1 is deleted from the write buffer may be advanced from a time point t_Dout to a time point t_Dout' by an amount of time "ta". The time point at which the third page buffer data chunk D3 is input to the page buffer group may be advanced from a time point t_DIn to a time point t_DIn' by an amount of time "tb".

Consequently, as the time point at which the cache data chunk that has been programmed is deleted from the write buffer is advanced, cache program performance constraints attributable to a limited write buffer size may be improved. Further, as the time point at which each cache data chunk is input to the page buffer group is advanced, a data transmission margin at the external operation completion time point and the internal operation completion time point may be increased, and thus cache program performance may be improved.

Figure 10A:
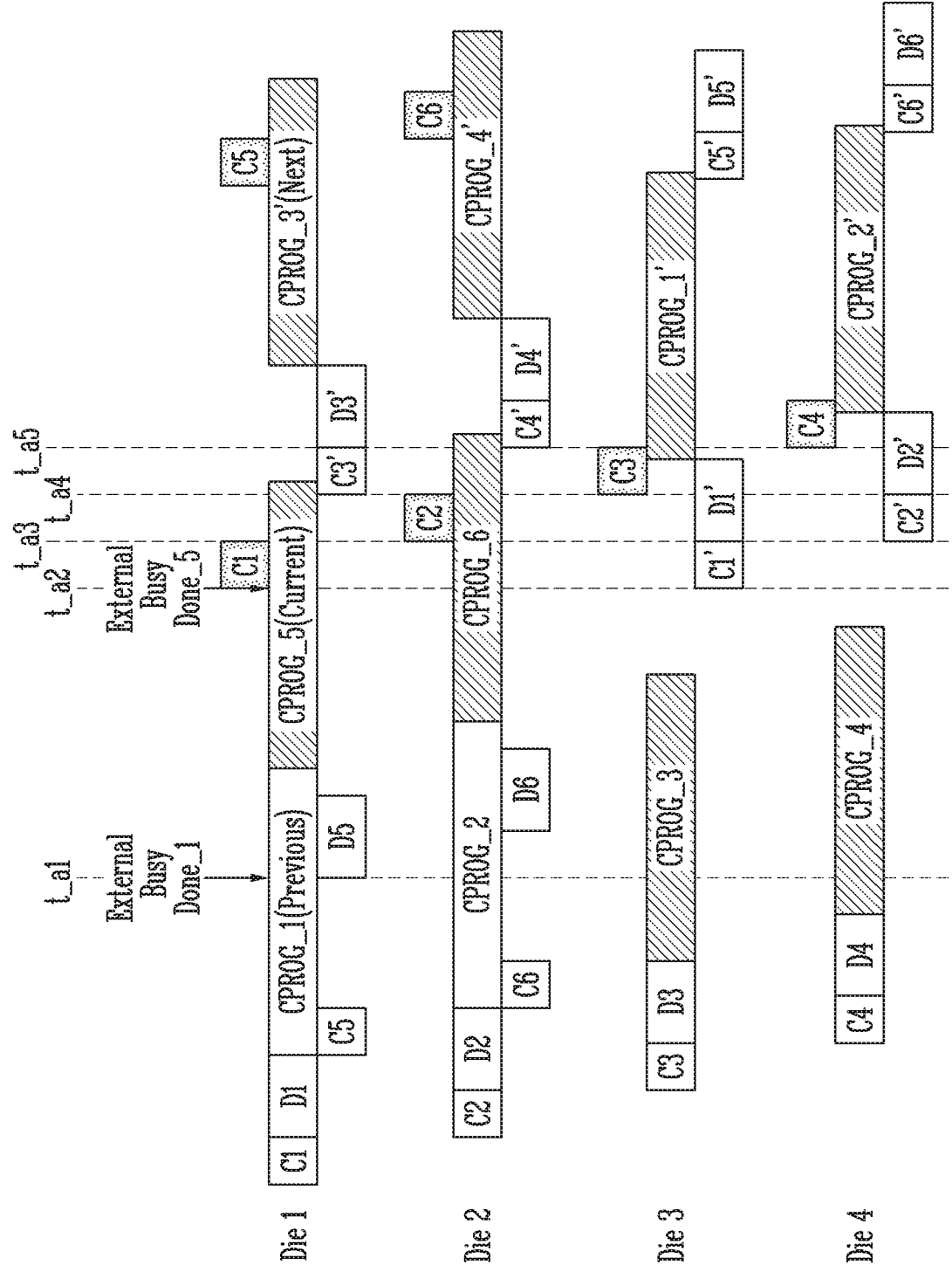
FIG. 10A is a timing diagram illustrating a cache program operation performed on multiple dies.

FIG. 10A is a timing diagram illustrating a cache program operation performed on multiple dies.

Referring to FIG. 10A, a memory controller may be coupled to a plurality of memory devices through a plurality of channels. In an embodiment, the number of channels or the number of memory devices coupled to each channel is not limited to the embodiment of the present disclosure.

In FIG. 10A, the memory controller may be coupled to first to fourth memory devices Die1 to Die4 through a common channel.

The memory controller may communicate with the first to fourth memory devices Die1 to Die4 one by one through the common channel. Therefore, only one memory device may communicate with the memory controller at one time. However, respective internal operations of the first to fourth memory devices Die1 to Die4 may be independently and simultaneously performed.

For example, the memory controller may transmit control signals, including a command and an address, and data to the first memory device Die1 through the common channel. While transmitting the data and the control signals to the first memory device Die1, the memory controller cannot transmit other data or other control signals to the remaining memory devices, that is, the second to fourth memory devices Die2 to Die4.

However, the second to fourth memory devices Die2 to Die4 may also perform internal operations of programming subsequently received data to memory cells included therein while the first memory device Die1 is performing an internal operation of programming the currently received data to memory cells included therein.

In FIG. 10A, the memory controller may perform a cache program operation on the first to fourth memory devices Die1 to Die4 in an interleaved manner. Therefore, the memory controller may sequentially provide a plurality of cache data chunks stored in the write buffer to respective memory devices.

Since the first to fourth memory devices Die1 to Die4 share a single channel, the remaining memory devices cannot receive subsequent cache data chunks while any one memory device is currently receiving a cache data chunk from the memory controller. However, the remaining memory devices may perform internal operations of programming previously received cache data chunks to memory cell arrays even while any one memory device is currently receiving a cache data chunk from the memory controller.

When cache data chunks are provided to respective memory devices in an interleaved manner, a time point at which a cache data chunk is received from the memory controller may be delayed as the number of memory devices coupled to the memory controller is increased. When the time point at which the cache data chunk is received is delayed, the cache program operation may be stopped. The cache program operation may be an operation of receiving a cache data chunk to be programmed by a subsequent program operation while a current program operation is being performed.

The cache data chunk stored in the write buffer may be input to the page buffer group. The cache data chunk input to the page buffer group may be a page buffer data chunk. The page buffer data chunk may be data identical to the cache data chunk.

In FIG. 10A, the write buffer may store first to sixth cache data chunks C1 to C6. First to sixth page buffer data chunks D1 to D6 may be pieces of data obtained when the first to sixth cache data chunks C1 to C6 are input to and stored in the page buffer group. Each cache data chunk and a page buffer data chunk corresponding thereto may be identical data. The number of cache data chunks stored in the write buffer is not limited to the present embodiment. Cache data chunks indicated as shaded portions may be cache data chunks deleted from the write buffer.

According to a cache program operation, a cache data chunk that has been programmed by the previous program operation may be deleted from the write buffer at an external operation completion time point for the current program operation. A page buffer data chunk to be programmed by a next program operation may also be input to the page buffer group at an external operation completion time point for the current program operation. The external operation completion time point may be a time point at which the programming of MSB data of a page buffer data chunk that is programmed by the cache program operation is completed.

In FIG. 10A, with respect to the first memory device Die1, a fifth page buffer data chunk D5 may be data that is being programmed by a current program operation. The first page buffer data chunk D1 may be data programmed by a previous program operation. A third page buffer data chunk D3' may be data to be programmed by a next program operation.

At a first time point t_a1, the fifth page buffer data chunk D5 may be input to the page buffer group. The first time point t_a1 may be a first external operation completion time point (External Busy Done_1). The first external operation completion time point (External Busy Done_1) may be a time point at which the programming of MSB data of the first page buffer data chunk D1 is completed.

At a second time point t_a2, the first cache data chunk C1 may be deleted from the write buffer at a fifth external operation completion time point (External Busy Done_5). The fifth external operation completion time point (External Busy Done_5) may be a time point at which the programming of MSB data of the fifth page buffer data chunk D5 that is currently being programmed is completed. The write buffer may receive a subsequent first cache data chunk C1' from the host and store the subsequent first cache data chunk C1' while deleting the current first cache data chunk C1.

At a third time point t_a3, the write buffer may receive a subsequent second cache data chunk C2' from the host and store the subsequent second cache data chunk C2' while deleting the current second cache data chunk C2. The third memory device Die3 may receive a subsequent first page buffer data chunk D1' from the write buffer of the memory controller. When the input of the subsequent first page buffer data chunk D1' has been completed, the third memory device Die3 may program the subsequent first page buffer data chunk D1' to the memory cell array.

At a fourth time point t_a4, the write buffer may receive a subsequent third cache data chunk C3' from the host and store the subsequent third cache data chunk C3' while deleting the current third cache data chunk C3. The fourth memory device Die4 may receive a subsequent second page buffer data chunk D2' from the write buffer of the memory controller. When the input of the subsequent second page buffer data chunk D2' has been completed, the fourth memory device Die4 may program the subsequent second page buffer data chunk D2' to the memory cell array.

At a fifth time point t_a5, the write buffer may receive a subsequent fourth cache data chunk C4' from the host and store the subsequent fourth cache data chunk C4' while deleting the current fourth cache data chunk C4. The first memory device Die1 may receive the subsequent third page buffer data chunk D3' from the write buffer of the memory controller. When the input of the subsequent third page buffer data chunk D3' has been completed, the first memory device Die1 may program the subsequent third page buffer data chunk D3' to the memory cell array.

In FIG. 10A, the first to fourth memory devices Die1 to Die4 may sequentially receive cache data chunks in an interleaved manner from the write buffer of the memory controller.

For example, after the first memory device Die1 has received the first cache data chunk C1 from the write buffer, the second memory device Die2 may receive the second cache data chunk C2 from the write buffer. After the second memory device Die2 has received the second cache data chunk C2, the third memory device Die3 may receive the third cache data chunk C3 from the write buffer. After the third memory device Die3 has received the third cache data chunk C3, the fourth memory device Die4 may receive the fourth cache data chunk C4 from the write buffer. After the fourth memory device Die4 has received the fourth cache data chunk C4, the first memory device Die1 may receive the fifth cache data chunk C5 from the write buffer. The first memory device Die1 may store the fifth cache data chunk C5 from the write buffer as the fifth page buffer data chunk D5 at the page buffer group at the first external operation completion time point (External Busy Done_1) at which the programming of MSB data of the first page buffer data chunk D1 is completed. After the first memory device Die1 has received the fifth cache data chunk C5, the second memory device Die2 may receive the sixth cache data chunk C6 from the write buffer. The second memory device Die2 may store the sixth cache data chunk C6 from the write buffer as the six page buffer data chunk D6 at the page buffer group at the second external operation completion time point (not illustrated) at which the programming of MSB data of the second page buffer data chunk D2 is completed.

Therefore, due to this interleaved manner, as the number of memory devices coupled to the memory controller is increased, a time point at which a cache data chunk is received from the memory controller may be delayed. When the time point at which a cache data chunk is received is delayed, and data to be programmed by a subsequent program operation cannot be received while a current program operation is being performed, the cache program operation may be a cache program operation that is not normally performed.

For example, a first cache program operation CPROG_1 of the first memory device Die1 may be a cache program operation that is normally performed. In the first cache program operation CPROG_1, while the first page buffer data chunk D1 is being programmed, the fifth page buffer data chunk D5 may be input to the first memory device Die1. The fifth page buffer data chunk D5 may be data to be programmed by a next program operation (i.e., a fifth cache program operation CPROG_5).

A cache program operation indicated as a hatched portion may be a cache program operation that is not normally performed. The fifth cache program operation CPROG_5 of the first memory device Die1 cannot be normally performed since the third page buffer data chunk D3' may not be input to the first memory device Die1 while the fifth page buffer data chunk D5 is being programmed. The third page buffer data chunk D3' may be data to be programmed by a next program operation (i.e., a subsequent third cache program operation CPROG_3').

In a similar way, a third cache program operation CPROG_3' of the first memory device Die1 may be a cache program operation that is not normally performed. A sixth cache program operation CPROG_6 and a fourth cache program operation CPROG_4' of the second memory device Die2 may be cache program operations that are not normally performed. A third cache program operation CPROG_3 and a first cache program operation CPROG_1' of the third memory device Die3 may be cache program operations that are not normally performed. A fourth cache program operation CPROG_4 and a second cache program operation CPROG_2' of the fourth memory device Die4 may be cache program operations that are not normally performed.

Figure 10B:
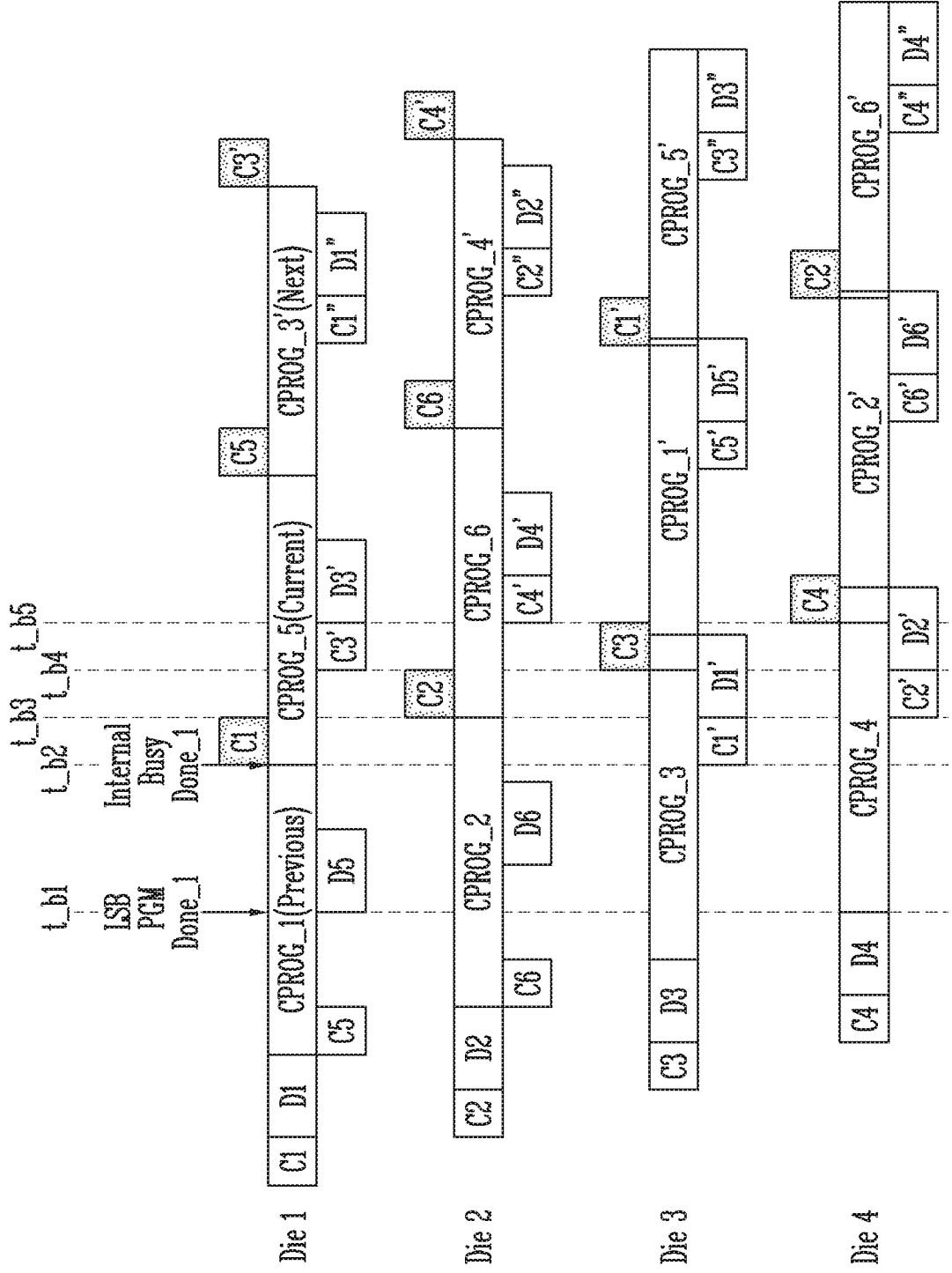
FIG. 10B is a timing diagram illustrating a cache program operation performed on multiple dies in accordance with an embodiment.

FIG. 10B is a timing diagram illustrating a cache program operation performed on multiple dies in accordance with an embodiment.

In FIG. 10B, with respect to a first memory device Die1, a fifth page buffer data chunk D5 may be data that is being programmed by a current program operation. A first page buffer data chunk D1 may be data programmed by a previous program operation. A third page buffer data chunk D3' may be data to be programmed by a next program operation.

In an embodiment, a cache data chunk that has been programmed and stored in the write buffer 210 by the previous program operation may be deleted from the write buffer 210 at an internal operation completion time point of the previous program operation. The internal operation completion time point may be a time point at which the programming of the corresponding page buffer data chunk is completed by the cache program operation.

In an embodiment, a page buffer data chunk to be programmed by a next program operation may be input to the page buffer group 123 at a data chunk LSB program completion time point of when the current program operation is completed. The data chunk LSB program completion time point may be a time point at which the programming of LSB data of a page buffer data chunk that is programmed by the cache program operation is completed.

For example, at a first time point t_b1, the fifth page buffer data chunk D5 may be input to the page buffer group 123. The first time point t_b1 may be a first data chunk LSB program completion time point (LSB PGM Done_1). The first data chunk LSB program completion time point (LSB PGM Done_1) may be a time point at which the programming of LSB data of the first page buffer data chunk D1 is completed. Here, the LSB data may be data corresponding to an LSB of three bits stored in a triple-level cell (TLC). In an embodiment, the LSB data may be data corresponding to an LSB of four bits stored in a quad-level cell (QLC).

At a second time point t_b2, a first cache data chunk C1 may be deleted from the write buffer 210 at a first internal operation completion time point (Internal Busy Done_1). The first internal operation completion time point (Internal Busy Done_1) may be a time point at which the programming of the first page buffer data chunk D1 is completed by a previous program operation. The write buffer 210 may receive a subsequent first cache data chunk C1' from the host and store the subsequent first cache data chunk C1' while deleting the current first cache data chunk C1.

At a third time point t_b3, the write buffer 210 may receive a subsequent second cache data chunk C2' from the host and store the subsequent second cache data chunk C2' while deleting the current second cache data chunk C2. A third memory device Die3 may receive a subsequent first page buffer data chunk D1' from the write buffer 210 of the memory controller 200. When the input of the subsequent first page buffer data chunk D1' has been completed, the third memory device Die3 may program the subsequent first page buffer data chunk D1' to the memory cell array 110.

At a fourth time point t_b4, the write buffer 210 may receive a subsequent third cache data chunk C3' from the host and store the subsequent third cache data chunk C3' while deleting the current third cache data chunk C3. A fourth memory device Die4 may receive a subsequent second page buffer data chunk D2' from the write buffer 210 of the memory controller 200. When the input of the subsequent second page buffer data chunk D2' has been completed, the fourth memory device Die4 may program the subsequent second page buffer data chunk D2' to the memory cell array 110.

At a fifth time point t_b5, the write buffer 210 may receive a subsequent fourth cache data chunk C4' from the host and store the subsequent fourth cache data chunk C4' while deleting the current fourth cache data chunk C4. The first memory device Die1 may receive a subsequent third page buffer data chunk D3' from the write buffer 210 of the memory controller 200. When the input of the subsequent third page buffer data chunk D3' has been completed, the first memory device Die1 may program the subsequent third page buffer data chunk D3' to the memory cell array.

Referring to FIG. 10B, a page buffer data chunk to be programmed by a next program operation may be input to the page buffer group 123 at a data chunk LSB program completion time point of a current program operation (for example, see the timing of the input of the subsequent first page buffer data chunk D1' to the third memory device Die 3 in FIG. 10B). The cache data chunk that has been programmed may be deleted from the write buffer 210 at the internal operation completion time of the previous program operation.

However, if a cache data chunk to be programmed by a next program operation is input while the current program operation is being performed, the current program operation may be a cache program operation that is normally performed.

Therefore, a first cache program operation CPROG_1 of the first memory device Die1 may be a cache program operation that is normally performed. During the first cache program operation CPROG_1, while the first page buffer data chunk D1 is being programmed, the fifth page buffer data chunk D5 may be input to the first memory device Die1. The fifth page buffer data chunk D5 may be data to be programmed by a next program operation. In a similar way, cache program operations of respective memory devices may be cache program operations that are normally performed.

It can be seen that, compared to the cache program operation of FIG. 10A, a time point at which a cache data chunk that has been programmed is deleted from the write buffer is advanced from the external operation completion time point of the current program operation to the internal operation completion time point of the previous program operation. It can be seen that the time point at which each cache data chunk is input to the page buffer group is advanced from the external operation completion time point of the current program operation to a data chunk LSB program completion time point of the previous program operation.

The internal operation completion time point may be a time point at which the programming of a cache data chunk that is being programmed is completed. The external operation completion time point may be a time point at which the programming of MSB data of a cache data chunk that is being programmed is completed. The data chunk LSB program completion time point may be a time point at which the programming of LSB data of a cache data chunk that is being programmed is completed.

Therefore, the extent to which the time point at which a cache data chunk is input from the memory controller 200 is delayed may be decreased. When the extent to which the time point at which a cache data chunk is input is delayed is decreased, frequency at which a cache program operation is not normally performed may be decreased. Since the frequency at which a cache program operation of each memory device is abnormally performed is decreased, the cache program operation performance of the storage device may be improved on the whole.

Figure 11:
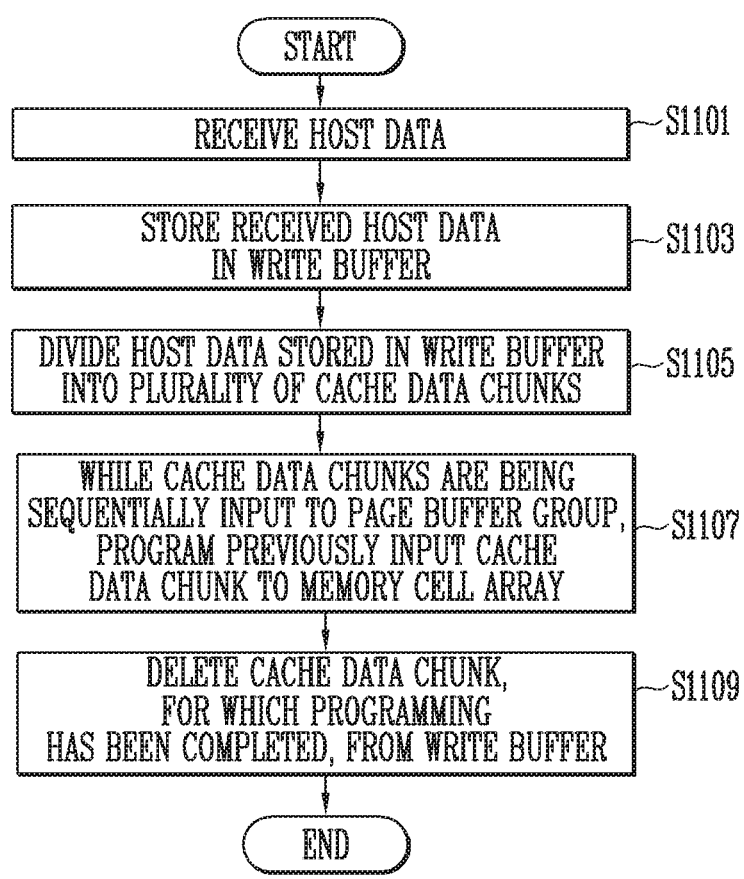
FIG. 11 is a flowchart illustrating the operation of a storage device in accordance with an embodiment.

FIG. 11 is a flowchart illustrating the operation of the storage device 50 in accordance with an embodiment.

Referring to FIG. 11, at step S1101, the storage device 50 may receive host data from a host.

At step S1103, the storage device 50 may store the received host data in the write buffer 210.

At step S1105, the storage device 50 may store the host data in the write buffer 210 by units of cache data chunks.

At step S1107, the storage device 50 may program a cache data chunk, previously input to the page buffer group 123, to the memory cell array 110 while the plurality of cache data chunks are being sequentially input to the page buffer group 123.

At step S1109, the storage device 50 may delete the cache data chunk, which has been programmed to the memory cell array 110, from the write buffer 210.

Figure 12:
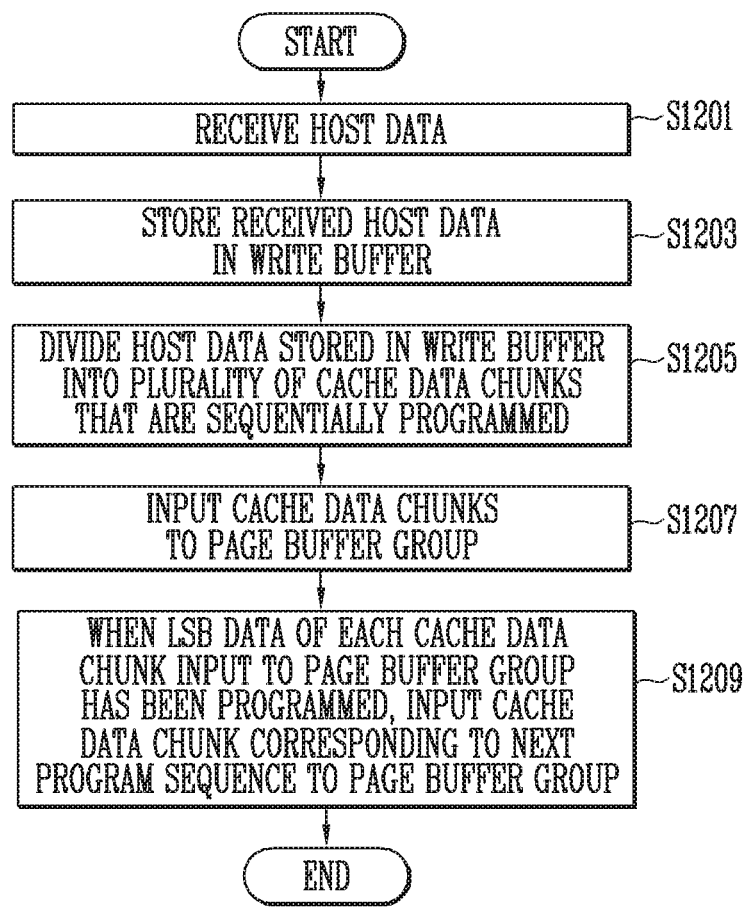
FIG. 12 is a flowchart illustrating the operation of a storage device in accordance with an embodiment.

FIG. 12 is a flowchart illustrating the operation of the storage device 50 in accordance with an embodiment.

Referring to FIG. 12, at step S1201, the storage device 50 may receive host data from a host.

At step S1203, the storage device may store the received host data in the write buffer 210.

At step S1205, the storage device may divide the host data stored in the write buffer 210 into a plurality of cache data chunks that are sequentially programmed.

At step S1207, the storage device 50 may input the cache data chunks to the page buffer group 123.

At step S1209, when LSB data of current cache data chunk input to the page buffer group 123 has been programmed, the storage device 50 may input a subsequent cache data chunk to the page buffer group 123.

Figure 13:
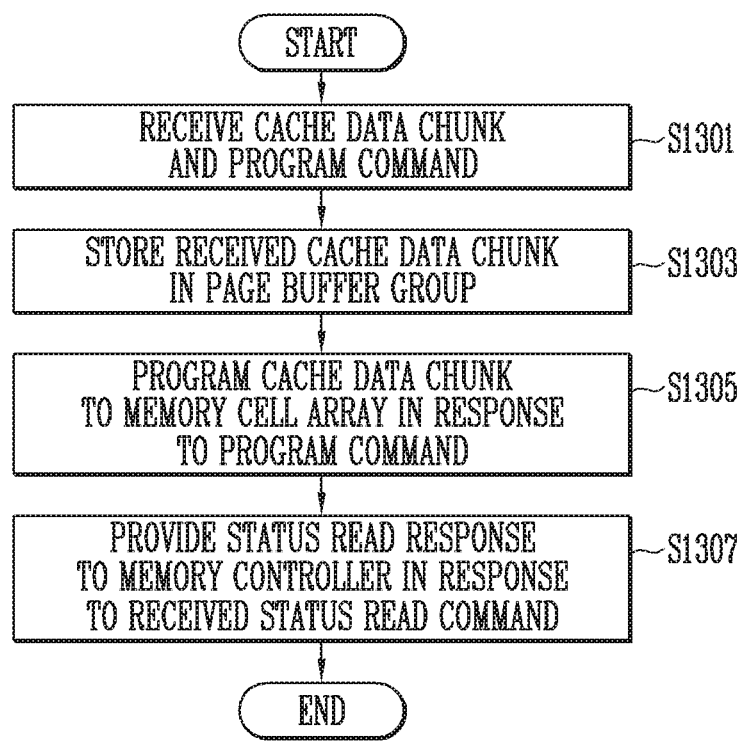
FIG. 13 is a flowchart illustrating the operation of a memory device in accordance with an embodiment.

FIG. 13 is a flowchart illustrating the operation of the memory device 100 in accordance with an embodiment.

Referring to FIG. 13, at step S1301, the memory device 100 may receive a cache data chunk and a program command from the memory controller 200.

At step S1303, the storage device 50 may store the received cache data chunk in the page buffer group 123.

At step S1305, the memory device 100 may program the cache data chunk, stored in the page buffer group 123, to the memory cell array 110 in response to the received program command.

At step S1307, the memory device 100 may provide a status read response to the memory controller 200 in response to a received status read command. The status read response may include ready information indicating whether the programming of the cache data chunk stored in the page buffer group 123 to the memory cell array 110 has been completed in response to the provided program command.

Figure 14:
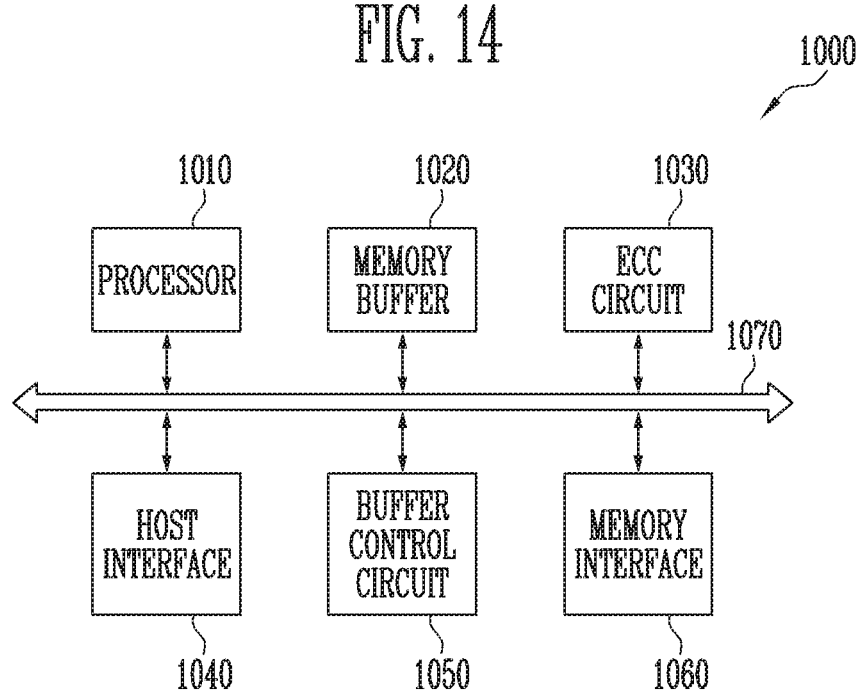
FIG. 14 is a diagram illustrating an embodiment of a memory controller of FIG. 1.

FIG. 14 is a diagram illustrating an embodiment of the memory controller of FIG. 1.

Referring to FIG. 14, a memory controller 1000 is coupled to a host and a memory device. In response to a request received from the host, the memory controller 1000 may access the memory device. For example, the memory controller 1000 may be configured to control write, read, erase, and background operations of the memory device. The memory controller 1000 may provide an interface between the memory device and the host. The memory controller 1000 may run firmware for controlling the memory device.

The memory controller 1000 may include a processor 1010, a memory buffer 1020, an error checking and correction (ECC) unit 1030, a host interface 1040, a buffer control circuit 1050, a memory interface 1060, and a bus 1070.

The bus 1070 may provide channels between components of the memory controller 1000.

The processor 1010 may control the overall operation of the memory controller 1000 and may perform a logical operation. The processor 1010 may communicate with an external host through the host interface 1040 and also communicate with the memory device through the memory interface 1060. Further, the processor 1010 may communicate with the memory buffer 1020 through the buffer control circuit 1050. The processor 1010 may control the operation of the storage device by using the memory buffer 1020 as a working memory, a cache memory or a buffer memory.

The processor 1010 may perform the function of a flash translation layer (FTL). The processor 1010 may translate a logical block address (LBA), provided by the host, into a physical block address (PBA) through the FTL. The FTL may receive the LBA using a mapping table and translate the LBA into the PBA. Examples of an address mapping method performed through the FTL may include various methods according to a mapping unit. Representative address mapping methods include a page mapping method, a block mapping method, and a hybrid mapping method.

The processor 1010 may randomize data received from the host. For example, the processing unit 1010 may use a randomizing seed to randomize data received from the host. The randomized data may be provided, as data to be stored, to the memory device and may be programmed in the memory cell array.

The processor may derandomize data received from the memory device during a read operation. For example, the processor 1010 may derandomize the data received from the memory device using a derandomizing seed. The derandomized data may be output to the host.

In an embodiment, the processor 1010 may run software or firmware to perform randomizing and derandomizing operations.

The memory buffer 1020 may be used as a working memory, a cache memory, or a buffer memory of the processor 1010. The memory buffer 1020 may store codes and commands executed by the processor 1010. The memory buffer 1020 may store data that is processed by the processor 1010. The memory buffer 1020 may include a static RAM (SRAM) or a dynamic RAM (DRAM).

The ECC circuit 1030 may perform error correction. The ECC circuit 1030 may perform error correction code (ECC) encoding based on data to be written to the memory device through the memory interface 1060. The ECC-encoded data may be transferred to the memory device through the memory interface 1060. The ECC circuit 1030 may perform ECC decoding based on data received from the memory device through the memory interface 1060. In an example, the ECC circuit 1030 may be included as the component of the memory interface 1060 in the memory interface 1060.

The host interface 1040 may communicate with the external host under the control of the processor 1010. The host interface 1040 may perform communication using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

The buffer control circuit 1050 may control the memory buffer 1020 under the control of the processor 1010.

The memory interface 1060 may communicate with the memory device under the control of the processor 1010. The memory interface 1060 may transmit/receive commands, addresses, and data to/from the memory device through channels.

In an embodiment, the memory controller 1000 may not include the memory buffer 1020 and the buffer control circuit 1050.

In an embodiment, the processor 1010 may control the operation of the memory controller 1000 using codes. The processor 1010 may load codes from a nonvolatile memory device (e.g., ROM) provided in the memory controller 1000. In an embodiment, the processor 1010 may load codes from the memory device through the memory interface 1060.

In an embodiment, the bus 1070 of the memory controller 1000 may be divided into a control bus and a data bus. The data bus may be configured to transmit data in the memory controller 1000, and the control bus may be configured to transmit control information such as commands or addresses in the memory controller 1000. The data bus and the control bus may be isolated from each other, and may neither interfere with each other nor influence each other. The data bus may be coupled to the host interface 1040, the buffer control circuit 1050, the ECC circuit 1030, and the memory interface 1060. The control bus may be coupled to the host interface 1040, the processor 1010, the buffer control circuit 1050, the memory buffer 1020, and the memory interface 1060.

Figure 15:
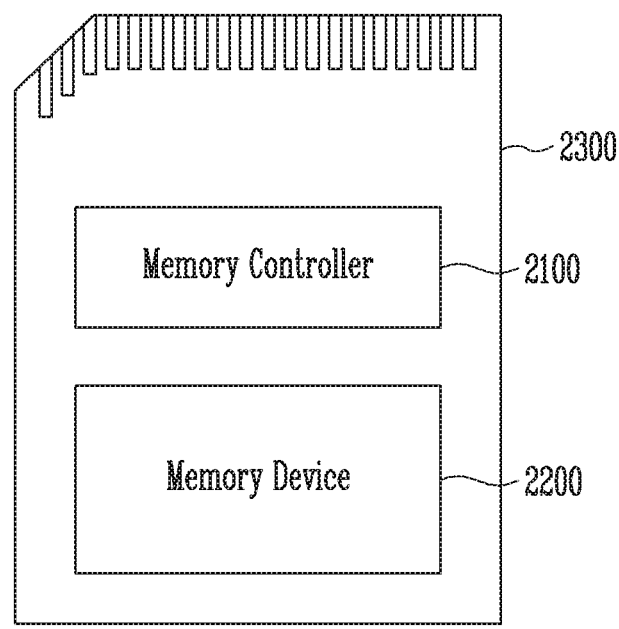
FIG. 15 is a block diagram illustrating a memory card system to which a storage device in accordance with an embodiment of the present disclosure is applied.

FIG. 15 is a block diagram illustrating a memory card system to which the storage device in accordance with an embodiment of the present disclosure is applied.

Referring to FIG. 15, a memory card system 2000 may include a memory controller 2100, a memory device 2200, and a connector 2300.

The memory controller 2100 is coupled to the memory device 2200. The memory controller 2100 may access the memory device 2200. For example, the memory controller 2100 may be control read, write, erase, and background operations of the memory device 2200. The memory controller 2100 may provide an interface between the memory device 2200 and a host. The memory controller 2100 may run firmware for controlling the memory device 2200. The memory controller 2100 may be implemented in the same way as the memory controller 200 described above with reference to FIG. 1.

In an embodiment, the memory controller 2100 may include components, such as a RAM, a processing unit, a host interface, a memory interface, and an ECC circuit.

The memory controller 2100 may communicate with an external device through the connector 2300. The memory controller 2100 may communicate with an external device (e.g., a host) based on a specific communication protocol. In an embodiment, the memory controller 2100 may communicate with the external device through at least one of various communication protocols such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and nonvolatile memory express (NVMe) protocols. In an embodiment, the connector 2300 may be defined by at least one of the above-described various communication protocols.

In an embodiment, the memory device 2200 may be implemented as any of various nonvolatile memory devices, such as an Electrically Erasable and Programmable ROM (EEPROM), a NAND flash memory, a NOR flash memory, a Phase-change RAM (PRAM), a Resistive RAM (Re-RAM), a Ferroelectric RAM (FRAM), a Spin-Torque Magnetic RAM (STT-M RAM).

The memory controller 2100 and the memory device 2200 may be integrated into a single semiconductor device to configure a memory card. For example, the memory controller 2100 and the memory device 2200 may be integrated into a single semiconductor device to configure a memory card such as a PC card (personal computer memory card international association: PCMCIA), a compact flash card (CF), a smart media card (SM or SMC), a memory stick, a multimedia card (MMC, RS-MMC, MMCmicro or eMMC), a SD card (SD, miniSD, microSD, or SDHC), or a universal flash storage (UFS).

Figure 16:
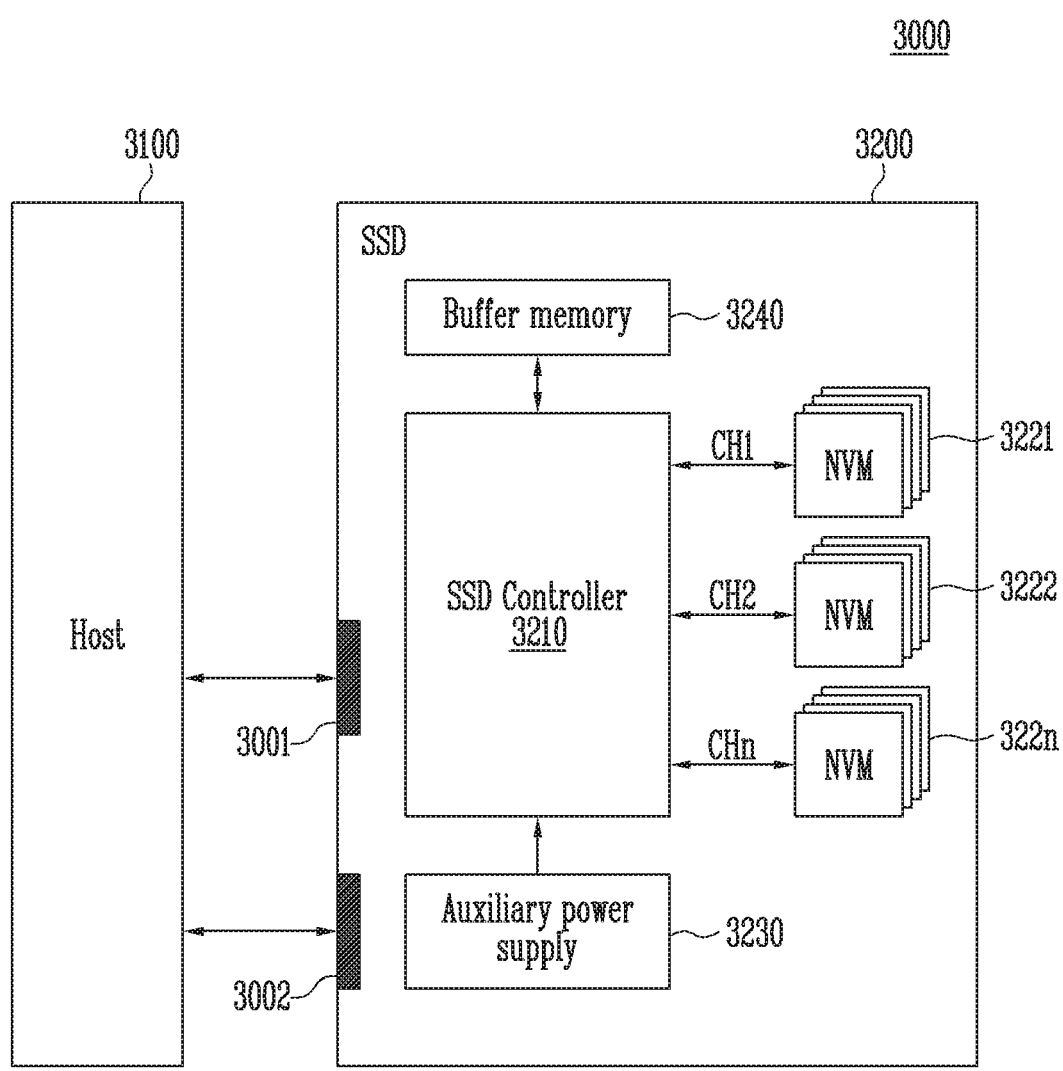
FIG. 16 is a block diagram illustrating a solid state drive (SSD) system to which the storage device in accordance with an embodiment of the present disclosure is applied.

FIG. 16 is a block diagram illustrating a solid state drive (SSD) system to which the storage device in accordance with an embodiment of the present disclosure is applied.

Referring to FIG. 16, an SSD system 3000 may include a host 3100 and an SSD 3200. The SSD 3200 may exchange signals SIG with the host 3100 through a signal connector 3001 and may receive power PWR through a power connector 3002. The SSD 3200 may include an SSD controller 3210, a plurality of flash memories 3221 to 322n, an auxiliary power supply 3230, and a buffer memory 3240.

In accordance with an embodiment of the present disclosure, the SSD controller 3210 may perform the function of the memory controller 200 described above with reference to FIG. 1.

The SSD controller 3210 may control the plurality of flash memories 3221 to 322n in response to the signals SIG received from the host 3100. In an embodiment, the signals SIG may be signals based on the interfaces of the host 3100 and the SSD 3200. For example, the signals SIG may be signals defined by at least one of various interfaces such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and nonvolatile memory express (NVMe) interfaces.

The auxiliary power supply 3230 may be coupled to the host 3100 through the power connector 3002. The auxiliary power supply 3230 may be supplied with power PWR from the host 3100 and may be charged. The auxiliary power supply 3230 may supply the power of the SSD 3200 when the supply of power from the host 3100 is not smoothly performed. In an embodiment, the auxiliary power supply 3230 may be positioned inside the SSD 3200 or positioned outside the SSD 3200. For example, the auxiliary power supply 3230 may be disposed in a main board and may supply auxiliary power to the SSD 3200.

The buffer memory 3240 functions as a buffer memory of the SSD 3200. For example, the buffer memory 3240 may temporarily store data received from the host 3100 or data received from the plurality of flash memories 3221 to 322n or may temporarily store metadata (e.g., mapping tables) of the flash memories 3221 to 322n. The buffer memory 3240 may include volatile memories such as DRAM, SDRAM, DDR SDRAM, LPDDR SDRAM, and GRAM or nonvolatile memories such as FRAM, ReRAM, STT-MRAM, and PRAM.

Figure 17:
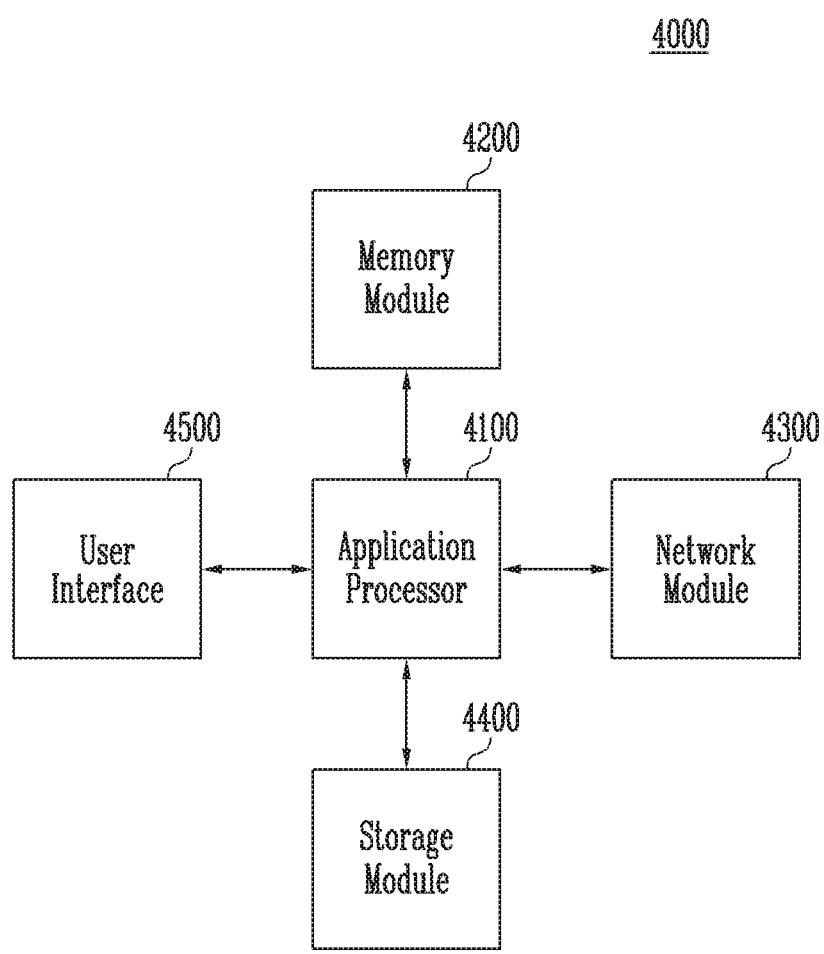
FIG. 17 is a block diagram illustrating a user system to which the storage device in accordance with an embodiment of the present disclosure is applied.

FIG. 17 is a block diagram illustrating a user system to which the storage device in accordance with an embodiment of the present disclosure is applied.

Referring to FIG. 17, a user system 4000 may include an application processor 4100, a memory module 4200, a network module 4300, a storage module 4400, and a user interface 4500.

The application processor 4100 may run components included in the user system 4000, an Operating System (OS) or a user program. In an embodiment, the application processor 4100 may include controllers, interfaces, graphic engines, etc. for controlling the components included in the user system 4000. The application processor 4100 may be provided as a system-on-chip (SoC).

The memory module 4200 may function as a main memory, a working memory, a buffer memory or a cache memory of the user system 4000. The memory module 4200 may include volatile RAMs such as DRAM, SDRAM, DDR SDRAM, DDR2 SDRAM, DDR3 SDRAM, LPDDR SDRAM, and LPDDR3 SDRAM, or nonvolatile RAMs such as PRAM, ReRAM, MRAM, and FRAM. In an embodiment, the application processor 4100 and the memory module 4200 may be packaged based on package-on-package (POP) and may then be provided as a single semiconductor package.

The network module 4300 may communicate with external devices. For example, the network module 4300 may support wireless communication, such as Code Division Multiple Access (CDMA), Global System for Mobile communication (GSM), wideband CDMA (WCDMA), CDMA-2000, Time Division Multiple Access (TDMA), Long Term Evolution (LTE), WiMAX, WLAN, UWB, Bluetooth, or Wi-Fi communication. In an embodiment, the network module 4300 may be included in the application processor 4100.

The storage module 4400 may store data. For example, the storage module 4400 may store data received from the application processor 4100. Alternatively, the storage module 4400 may transmit the data stored in the storage module 4400 to the application processor 4100. In an embodiment, the storage module 4400 may be implemented as a nonvolatile semiconductor memory device, such as a Phase-change RAM (PRAM), a Magnetic RAM (MRAM), a Resistive RAM (RRAM), a NAND flash memory, a NOR flash memory, or a NAND flash memory having a three-dimensional (3D) structure. In an embodiment, the storage module 4400 may be provided as a removable storage medium (i.e., removable drive), such as a memory card or an external drive of the user system 4000.

In an embodiment, the storage module 4400 may include a plurality of nonvolatile memory devices, each of which may be operated in the same way as the memory device 100 described above with reference to FIG. 1. The storage module 4400 may be operated in the same way as the storage device 50 described above with reference to FIG. 1.

The user interface 4500 may include interfaces which input data or instructions to the application processor 4100 or output data to an external device. In an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as a Liquid Crystal Display (LCD), an Organic Light Emitting Diode (OLED) display device, an Active Matrix OLED (AMOLED) display device, an LED, a speaker, and a motor.

In accordance with the present disclosure, there are provided a storage device having improved cache performance and a method of operating the storage device.

While the exemplary embodiments of the present disclosure have been disclosed for illustrative purposes, those skilled in the art will appreciate that various modifications, additions and substitutions are possible. Therefore, the scope of the present disclosure must be defined by the appended claims and equivalents of the claims rather than by the description preceding them.

Although the embodiments of the present disclosure have been disclosed, those skilled in the art will appreciate that various modifications, additions and substitutions are possible, without departing from the scope and spirit of the present disclosure.

Therefore, the scope of the present disclosure must be defined by the appended claims and equivalents of the claims rather than by the description preceding them.

In the above-discussed embodiments, all steps may be selectively performed or skipped. In addition, the steps in each embodiment may not always be sequentially performed in given order, and may be randomly performed. Furthermore, the embodiments disclosed in the present specification and the drawings aims to help those with ordinary knowledge in this art more clearly understand the present disclosure rather than aiming to limit the bounds of the present disclosure. In other words, one of ordinary skill in the art to which the present disclosure belongs will be able to easily understand that various modifications are possible based on the technical scope of the present disclosure.

Embodiments of the present disclosure have been described with reference to the accompanying drawings, and specific terms or words used in the description should be construed in accordance with the spirit of the present disclosure without limiting the subject matter thereof. It should be understood that many variations and modifications of the basic inventive concept described herein will still fall within the spirit and scope of the present disclosure as defined in the appended claims and their equivalents.

What is claimed is:

1. A storage device comprising:
a memory device including a memory cell array and a page buffer group coupled to the memory cell array; and
a memory controller configured to:
store a plurality of cache data chunks to be sequentially programmed,
input a next cache data chunk corresponding to a next program sequence to the page buffer group when programming Least Significant Bit (LSB) data of a current cache data chunk among the plurality of cache data chunks is completed, and
delete the current cache data chunk from the memory controller when programming of the current cache data chunk previously input to the page buffer group to the memory cell array has been completed while the plurality of cache data chunks are being input to the page buffer group.

2. The storage device according to claim 1, wherein the memory controller comprises:
a write buffer configured to store the plurality of cache data chunks; and
a write buffer controller configured to sequentially input the plurality of cache data chunks to the page buffer group.

3. The storage device according to claim 2, wherein the write buffer controller is configured to input the next cache data chunk to the page buffer group, when the programming of the LSB data of the current cache data chunk that is being programmed is completed.

4. The storage device according to claim 2, wherein the write buffer controller is configured to generate a data input signal for requesting input of the next cache data chunk to the page buffer group, and provide the data input signal to the write buffer, and
wherein the write buffer inputs the next cache data chunk to the page buffer group in response to the data input signal.

5. The storage device according to claim 1, wherein the memory device further comprises a cache program operation controller configured to program cache data chunks that are input to the page buffer group to the memory cell array.

6. The storage device according to claim 1, wherein the page buffer group is configured to store the next cache data chunk received from the memory controller.

7. A storage device comprising:
a memory device including a memory cell array and a page buffer group coupled to the memory cell array; and
a memory controller including a write buffer and a write buffer controller,
wherein the write buffer is configured to store a plurality of cache data chunks to be sequentially programmed, and
wherein the write buffer controller is configured to delete the previous cache data chunk from the write buffer when programming of a previous cache data chunk previously input to the page buffer group to the memory cell array has been completed while the plurality of cache data chunks are being input to the page buffer group.

8. The storage device according to claim 7, wherein the write buffer controller is configured to sequentially input the plurality of cache data chunks to the page buffer group.

9. The storage device according to claim 8, wherein the write buffer controller is configured to provide a program command for instructing each cache data chunk to be stored in the memory cell array to the memory device.

10. The storage device according to claim 8, wherein the write buffer controller is configured to delete the cache data chunk stored in the write buffer when programming of each cache data chunk to the memory cell array is completed.

11. The storage device according to claim 10, wherein the write buffer controller is configured to provide a data delete signal for requesting deletion of the cache data chunk and provide the data delete signal to the write buffer, and
wherein the write buffer is configured to delete the cache data chunk in response to the data delete signal.

12. The storage device according to claim 8, wherein the write buffer controller is configured to provide a status read command to the memory device and determine whether to delete the cache data chunk based on a status read response provided by the memory device in response to the status read command.

13. The storage device according to claim 12, wherein the status read response includes ready information indicating whether programming of the cache data chunk to the memory cell array has been completed.

14. A method for operating a storage device, the storage device comprising a memory device including a memory cell array and a page buffer group coupled to the memory cell array and a memory controller including a write buffer, the method comprising:
 storing host data as a plurality of cache data chunks in the write buffer;
 programming any one of the plurality of cache data chunks to the memory cell array while the plurality of cache data chunks are being sequentially input to the page buffer group;
 inputting a next cache data chunk corresponding to a next program sequence to the page buffer group when programming LSB data of a current cache data chunk has been completed; and
 deleting the current cache data chunk from the write buffer when programming of the current cache data chunk previously input to the page buffer group to the memory cell array has been completed while the plurality of cache data chunks are being input to the page buffer group.

15. The method according to claim 14, further comprising programming the next cache data chunk to the memory cell array.

16. The method according to claim 14, wherein inputting the next cache data chunk comprises:
 generating a data input signal for requesting input of the next cache data chunk to the page buffer group; and
 inputting the next cache data chunk to the page buffer group in response to the data input signal.

17. The method according to claim 14, further comprising deleting the current cache data chunk from the write buffer depending on whether programming of the current cache data chunk to the memory cell array has been completed.

18. The method according to claim 17, wherein the current cache data chunk is deleted from the write buffer at a time point at which the programming of the current cache data chunk to the memory cell array is completed.

19. The method according to claim 14, wherein, whether the programming of the current cache data chunk to the memory cell array has been completed is determined depending on a status read response that is provided by the memory device in response to a status read command provided by the memory controller.

20. The method according to claim 19, wherein the status read response includes ready information indicating whether the programming of the cache data chunk to the memory cell array has been completed.

\* \* \* \* \*